(12) United States Patent
Czubatyj et al.

(10) Patent No.: US 8,363,446 B2
(45) Date of Patent: *Jan. 29, 2013

(54) MULTILEVEL VARIABLE RESISTANCE MEMORY CELL UTILIZING CRYSTALLINE PROGRAMMING STATES

(75) Inventors: Wolodymyr Czubatyj, Warren, MI (US); Tyler Lowrey, Rochester Hills, MI (US); Charles Dennison, San Jose, CA (US); Carl Schell, Waterford, MI (US)

(73) Assignee: Ovonyx, Inc., Sterling Heights, MI (US)

( * ) Notice: Subject to any disclaimer, the term of this patent is extended or adjusted under 35 U.S.C. 154(b) by 443 days.

This patent is subject to a terminal disclaimer.

(21) Appl. No.: 12/578,638

(22) Filed: Oct. 14, 2009

(65) Prior Publication Data
US 2010/0027328 A1 Feb. 4, 2010

Related U.S. Application Data

(63) Continuation-in-part of application No. 11/032,345, filed on Jan. 10, 2005, now Pat. No. 7,923,724.

(51) Int. Cl.
*G11C 11/00* (2006.01)
(52) U.S. Cl. ........................................ 365/148; 365/163
(58) Field of Classification Search .................. 365/148, 365/163
See application file for complete search history.

(56) References Cited

U.S. PATENT DOCUMENTS

| | | | | |
|---|---|---|---|---|
| 5,098,761 A | * | 3/1992 | Watanabe et al. | 428/64.5 |
| 7,005,665 B2 | * | 2/2006 | Furkay et al. | 257/2 |
| 7,923,724 B2 | * | 4/2011 | Czubatyj | 257/49 |

* cited by examiner

*Primary Examiner* — Huan Hoang
(74) *Attorney, Agent, or Firm* — Kevin L. Bray

(57) ABSTRACT

A method of programming an electrical variable resistance memory device. When applied to variable resistance memory devices that incorporate a phase-change material as the active material, the method utilizes a plurality of crystalline programming states. The crystalline programming states are distinguishable on the basis of resistance, where the resistance values of the different states are stable with time and exhibit little or no drift. As a result, the programming scheme is particularly suited to multilevel memory applications. The crystalline programming states may be achieved by stabilizing crystalline phases that adopt different crystallographic structures or by stabilizing crystalline phases that include mixtures of two or more distinct crystallographic structures that vary in the relative proportions of the different crystallographic structures. The programming scheme incorporates at least two crystalline programming states and further includes at least a third programming state that may be a crystalline, amorphous or mixed crystalline-amorphous state.

50 Claims, 12 Drawing Sheets

MULTILEVEL VARIABLE RESISTANCE MEMORY CELL UTILIZING CRYSTALLINE PROGRAMMING STATES

RELATED APPLICATION INFORMATION

This application is a continuation in part of U.S. patent application Ser. No. 11/032,345 entitled "Phase-change Memory that Switches between Crystalline Phases" and filed on Jan. 10, 2005 U.S. Pat. No. 7,923,724, the disclosure of which is incorporated in its entirety herein.

FIELD OF INVENTION

This invention relates to the operation of variable resistance memory devices. More particularly, this invention relates to a method of programming that reduces the deleterious effect of drift on the stability of the resistance states of phase-change materials in multilevel memory devices. Most particularly, this invention relates to a method of programming a phase-change material in a multilevel device that utilizes crystalline programming states having low drift.

BACKGROUND OF THE INVENTION

Variable resistance materials are promising active materials for next-generation electronic storage and computing devices. A variable resistance material is a material that possesses two or more states that differ in electrical resistance. The material can be programmed back and forth between the states by providing energy to induce an internal chemical, electronic, or physical transformation of the material that manifests itself as a change in resistance of the material. The different resistance states are distinguishable and can be used as memory states to store or process data.

Phase change materials are a promising class of variable resistance materials. A phase change material is a material that is capable of undergoing a transformation, preferably reversible, between two or more distinct structural states. The distinct structural states may be distinguished on the basis of, for example, crystal structure, atomic arrangement, order or disorder, fractional crystallinity, relative proportions of two or more different structural states, or a physical (e.g. electrical, optical, magnetic, mechanical) or chemical property. In a common embodiment, the two or more distinct structural states include differing proportions of crystalline phase regions and amorphous phase regions of the phase change material, where the phase-change material is reversibly transformable between the different states. In the crystalline state, the phase change material has lower resistivity; while in the amorphous state, it has higher resistivity. Continuous variations in resistivity over a wide range can be achieved through control of the relative proportions of crystalline phase regions and amorphous phase regions in a volume of phase-change material. Reversibility of the transformations between structural states permits reuse of the material over multiple cycles of operation.

Typically, a programmable resistance device is fabricated by placing the active variable resistance material, such as a phase change material, between two electrodes. Operation of the device is effected by providing an electrical signal between the two electrodes and across the active material. In a common application, phase-change materials may be used as the active material of a memory device, where distinct data values are associated with the different structural states and each data value corresponds to a distinct resistance range of the phase-change material. The different structural states employed in memory operation may also be referred to herein as memory states or resistance states of the phase-change material. Write operations in a phase-change memory device, which may also be referred to herein as programming operations, apply electric pulses to the phase-change material to alter its structural state to a state having the resistance associated with the intended data value. Read operations are performed by providing current or voltage signals across the two electrodes to measure the resistance. The energy of the read signal is sufficiently low to prevent disturbance of the structural state of the phase-change material.

Phase-change memory devices are today typically operated in binary mode. In binary mode, the memory is operated between two structural states. To improve read margin and minimize read error, the two structural states for binary operation are selected to provide a large resistance contrast. The range of resistance values of a phase-change material is bounded by a set state having a set resistance and a reset state having a reset resistance. The set state is a low resistance structural state whose electrical properties are primarily controlled by the crystalline portion of the phase-change material and the reset state is a high resistance structural state whose electrical properties are primarily controlled by the amorphous portion of the phase-change material. The set state and reset state are commonly employed in binary operation and may be associated with the conventional binary "0" and "1" states.

In order to expand the commercial opportunities for phase-change memory, it is desirable to identify new phase-change compositions, device structures, and methods of programming that lead to improved performance. A key performance metric for memory devices is storage density, which is a measure of the amount of information that can be stored per unit area of memory material. Miniaturization is the most common strategy for increasing storage density. By shrinking the area required to store a bit of information, more bits can be stored in a memory chip of a given size. Miniaturization has been a successful strategy for increasing storage density over the past four decades, but is becoming increasingly more difficult to employ as fundamental size limits of manufacturability are reached.

An alternative approach for increasing storage density is to increase the number of bits stored in a given area of memory. Instead of reducing the area in which information is stored, the objective is to store more bits of information in a particular area of memory. In conventional binary operation, only a single bit of information is stored in each memory location. Higher storage density can be achieved by increasing the storage capacity of each memory location. If two bits, for example, can be stored at each memory location, the storage capacity doubles without miniaturizing the memory location. In order to increase the storage capacity of each memory location, it is necessary for the memory material to be operable over more than the two states used in binary (single bit) operation. Two-bit operation, for example, requires a material that is operable over four distinguishable memory states.

Phase-change memory materials have the potential to provide multiple bit operation because of the wide resistance range that separates the set and reset states. In a typical phase-change memory device, the resistance of the set state is on the order of ~1-10 kΩ, while the resistance of the reset state is on the order of ~100-1000 kΩ. Since the structural states of a phase-change material are essentially continuously variable over the range of proportions of crystalline and amorphous phase volume fractions extending from the set state to the reset state, memory operation of a phase-change material at memory states having resistances intermediate between the set resistance and reset resistance is possible. As a result, multiple bit memory operation over multiple memory states is achievable with phase-change memory materials.

Although phase-change memory offers the potential for multiple bit operation, progress toward achieving a practical multilevel phase-change memory has been limited. One of the practical complications associated with multilevel phase-change operation is resistance drift over time. It is common in phase-change memory devices to observe a variation in the resistance of a memory state over time. If a phase-change memory device is programmed into a particular state having a particular resistance at one time, the resistance of the device at a later time may be different. As a general rule, resistance increases with time and becomes more pronounced as the amorphous phase volume fraction of a structural state increases. Resistance drift is not problematic for binary operation of phase-change memory because the set state shows little or no drift in resistance over time, while the reset state shows an increase in resistance over time. As a result, the resistance contrast between the set and reset states increases over time and no impairment of performance occurs.

Resistance drift, however, becomes problematic in multilevel applications of phase-change memory devices because time variations in resistance may lead to overlap in the identification of memory states. In order to advance the performance capabilities and commercial potential of phase-change memory, it is desirable to develop phase-change materials, device structures or methods of operating phase-change memory devices that eliminate, counteract, or circumvent resistance drift.

SUMMARY OF THE INVENTION

This invention provides a method for programming phase-change memory in a multilevel mode of operation that diminishes the practical effect of resistance drift on performance. The programming method recognizes that the intrinsic drift of crystalline phase states of a phase-change material is much less pronounced than the intrinsic drift of amorphous phase states. The method accordingly provides a programming strategy that utilizes two or more crystalline programming states based on different crystalline phases.

The method generally permits programming between three or more states that are resolvable on the basis of resistance where at least two of the programming states are crystalline states. In one embodiment, the method utilizes two or more crystalline states and an amorphous or partially amorphous state as programming states. The two or more crystalline programming states are distinguishable on the basis of resistance and exhibit little or no drift in resistance over time. The amorphous or partially amorphous programming state has a much higher resistance than any of the crystalline programming states and may exhibit a drift in resistance over time. The resistance drift of the amorphous or partially amorphous state does not, however, lead to ambiguity in identifying programming states. In one embodiment, drift causes the resistance of the amorphous or partially amorphous state to increase in time at a rate that increases the resistance contrast between the amorphous or partially amorphous state and any of the crystalline programming states. As a result, overlapping of states is avoided.

In one embodiment, the programming method utilizes at least two crystalline programming states and one amorphous programming state. In another embodiment, the programming method utilizes at least two crystalline programming states and a mixed crystalline-amorphous programming state. In still another embodiment, the programming method utilizes at least three crystalline programming states. Additional crystalline, mixed crystalline-amorphous, and amorphous states may be included in the method along with the at least two crystalline states to obtain additional programming states. In one embodiment, the method includes four or more programming states. In another embodiment, the method includes six or more programming states. In a further embodiment, the method includes eight or more programming states.

The crystalline programming states may be different crystalline phases of a phase-change material. In one embodiment, the at least two crystalline programming states include one state that is predominantly face-centered cubic and a second state that is predominantly hexagonal, where the resistances of the face-centered cubic and hexagonal states are distinguishable. In another embodiment, the at least two crystalline programming states include one state that is predominantly face-centered cubic and one state that is a mixture of face-centered cubic and hexagonal phases. In still another embodiment, the at least two crystalline programming states include one state that is predominantly hexagonal and one state that is a mixture of face-centered cubic and hexagonal phases. In a further embodiment, the at least two crystalline programming states include one state that is predominantly face-centered cubic, one state that is a mixture of face-centered cubic and hexagonal phases, and one state that is predominantly hexagonal. Each of the foregoing may further include one or more amorphous or partially amorphous programming states.

DETAILED DESCRIPTION OF THE ILLUSTRATED EMBODIMENTS

Figure 1:
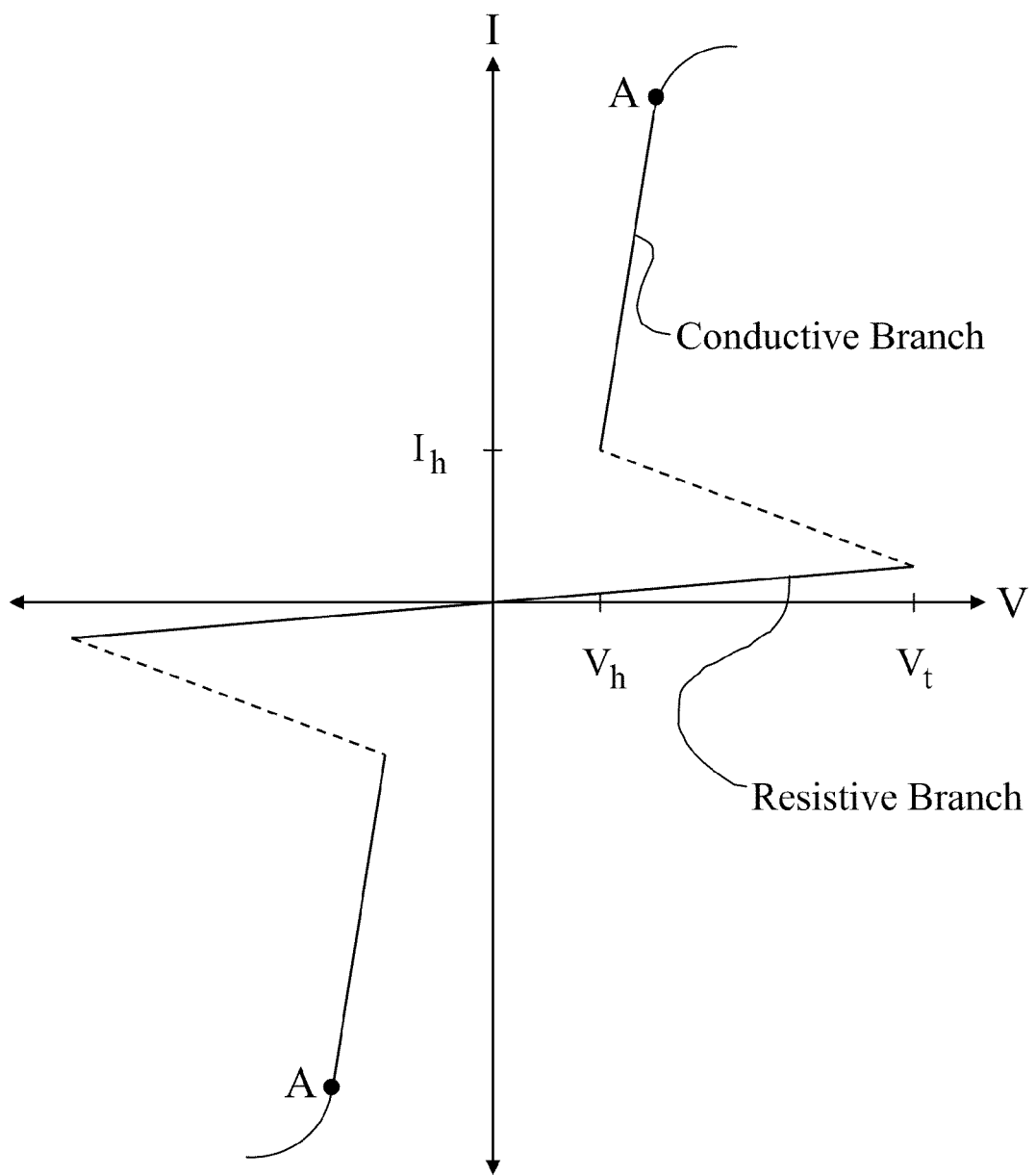
FIG. 1 is a depiction of the I-V characteristics of a chalcogenide material that exhibits an electrical switching transformation from a resistive state to a conductive state.

Although this invention will be described in terms of certain preferred embodiments, other embodiments that are apparent to those of ordinary skill in the art, including embodiments that do not provide all of the benefits and features set forth herein, are also within the scope of this invention. Accordingly, the scope of the invention is defined only by reference to the appended claims.

The instant invention is directed at enabling multilevel operation of phase-change memory devices by selecting programming states that diminish the negative consequences associated with resistance drift. In order to appreciate the benefits of the instant invention, it is helpful to review the basic operational characteristics of phase-change memory materials and devices and to discuss the problem of resistance drift. The following discussion focuses on chalcogenide materials as illustrative phase-change materials. The basic principles apply equally to other forms of phase-change, state-change or variable resistance materials, such as pnictides or other classes of materials transformable between two or more states distinguishable on the basis of structure, physical property or chemical property.

An important feature of the chalcogenide materials in the operation of chalcogenide-based phase-change memory devices and arrays is their ability to undergo a phase transformation between or among two or more structural states. The chalcogenide materials have structural states that may include a crystalline state, one or more partially-crystalline states and an amorphous state. The crystalline state may be a single crystalline state or a polycrystalline state. A partially-crystalline state refers to a structural state in which a volume of chalcogenide or phase-change material includes an amorphous portion and a crystalline portion. A partially-crystalline state may also be referred to herein as a mixed crystalline-amorphous state. Generally, a plurality of partially-crystalline states exists for the chalcogenide or phase-change material that may be distinguished on the basis of the relative proportion of the amorphous and crystalline portions. Fractional crystallinity is one way to characterize the structural states of a chalcogenide phase-change material. The fractional crystallinity of the crystalline state is 100%, the fractional crystallinity of the amorphous state is 0%, and the fractional crystallinities of the partially-crystalline states may vary continuously between 0% (the amorphous limit) and 100% (the crystalline limit). Phase-change chalcogenide materials are thus able to transform among a plurality of structural states that vary inclusively between fractional crystallinities of 0% and 100%.

Transformations among the structural states are induced by providing energy to the chalcogenide material. Energy in various forms can induce structural transformations of the crystalline and amorphous portions and thus can influence the fractional crystallinity of a chalcogenide material. Suitable forms of energy include one or more of electrical energy, thermal energy, optical energy or other forms of energy (e.g. particle-beam energy) that induce electrical, thermal or optical effects in a chalcogenide material. Continuous and reversible variability of the fractional crystallinity is achievable by controlling the energy environment of a chalcogenide material. A crystalline state can be transformed to a partially-crystalline or an amorphous state, a partially-crystalline state can be transformed to a crystalline, amorphous or different partially-crystalline state, and an amorphous state can be transformed to a partially-crystalline or crystalline state through proper control of the energy environment of a chalcogenide material. Some considerations associated with the use of thermal, electrical and optical energy to induce structural transformations are presented in the following discussion.

The use of thermal energy to induce structural transformations exploits the thermodynamics and kinetics associated with the crystalline to amorphous or amorphous to crystalline phase transitions. An amorphous phase may be formed, for example, from a partially-crystalline or crystalline state by heating a chalcogenide material above its melting temperature and cooling at a rate sufficient to inhibit the formation of crystalline phases. A crystalline or higher fractional crystallinity phase may be formed from an amorphous or partially-crystalline state, for example, by heating a chalcogenide material above the crystallization temperature for a sufficient period of time to effect nucleation and/or growth of crystalline domains. The crystallization temperature is below the melting temperature and corresponds to the minimum temperature at which crystallization may occur in a practical amount of time. The driving force for crystallization is typically thermodynamic in that the free energy of a crystalline or partially-crystalline state in many chalcogenide materials is lower than the free energy of an amorphous state so that the overall energy of a chalcogenide material decreases as the fractional crystallinity increases. Formation (nucleation and growth) of a crystalline state or crystalline domains within a partially-crystalline or amorphous state is kinetically enabled up to the melting temperature, so that heating promotes crystallization by providing energy that facilitates the rearrangements of atoms needed to form crystalline phases or domains.

The fractional crystallinity of a partially-crystalline state can be controlled by controlling the temperature or time of heating of the partially-crystalline state or by controlling the temperature or rate of cooling of an amorphous or partially-crystalline state. Through proper control of the peak temperature, time of heating and rate of cooling, structural states over the full range of fractional crystallinity can be achieved for the chalcogenide phase-change materials.

The use of electrical energy to induce structural transformations relies on the application of electrical (current or voltage) pulses to a chalcogenide material. The mechanism of electrically-induced structural transformations includes Joule heating created by resistance to current flow. Joule heating corresponds to a conversion of electrical energy to thermal energy and leads to an increase in the temperature of the chalcogenide material. By controlling the current density, the temperature can be controlled.

The crystalline phase portions of a chalcogenide material are sufficiently conductive to permit current densities that provide efficient Joule heating. The amorphous phase portions, however, are much less conductive and ordinarily would not support current densities sufficient to heat the material to the crystallization temperature. As described more fully hereinbelow, however, the amorphous phase of many chalcogenide materials can be electrically switched to a highly conductive intermediate (dynamic) state upon application of a voltage greater than the threshold voltage. In the intermediate state, the material can support a current density that is high enough to heat the material to the crystallization temperature through Joule heating. By controlling the magnitude and/or duration of electrical pulses applied to a chalcogenide phase-change material, it is possible to continuously vary the fractional crystallinity through controlled interconversion of the crystalline and amorphous phases.

The influence of electrical energy on a chalcogenide material is generally depicted in terms of the I-V (current-voltage) and R-I (resistance-current) relationships of the material. The I-V relationship shows the current response of a chalcogenide material as a function of applied voltage and the R-I relationship shows the variation of the electrical resistance of a chalcogenide material as a result of applying electrical energy or as a function of the magnitude of the current or voltage pulse applied to a chalcogenide material. The resistance plotted on the R-I plot is the resistance measured at a fixed time (t0) after the application of the current pulse (I) and is measured at a sufficiently low voltage as to not disturb the memory state. A brief discussion of the I-V and R-I characteristics of chalcogenide materials follows.

The I-V response of many chalcogenide materials exhibits an electrical switching event in which the chalcogenide material undergoes a transformation from a more resistive state to a more conductive state. When present, an electrical switching event is generally observed only in amorphous phase chalcogenide materials or mixed crystalline-amorphous phase chalcogenide materials and is ordinarily not observed in crystalline phase chalcogenide materials. As discussed more fully hereinbelow, the limiting crystalline and amorphous phase structural states of a chalcogenide phase-change material are normally referred to as the "set" and "reset" states, respectively. FIG. 1 and the following discussion of electrical switching is an illustrative example that presupposes that the chalcogenide material is initially in the reset state.

A schematic depiction of the electrical switching event is presented in FIG. 1. The depiction of FIG. 1 corresponds to a two-terminal device configuration in which two spacedly disposed electrodes are in contact with a chalcogenide material and the current I corresponds to the current passing between the two electrodes. The I-V curve of FIG. 1 shows the current passing through the chalcogenide material as a function of the voltage applied across the material by the electrodes. The I-V characteristics of the material are often symmetric with respect to the polarity of the applied voltage as shown in FIG. 1. For convenience, we consider the first quadrant of the I-V plot of FIG. 1 (the portion in which current and voltage are both positive) in the discussion of chalcogenide switching behavior that follows. An analogous description that accounts for polarity applies to the third quadrant of the I-V plot.

The I-V curve includes a resistive branch and a conductive branch. The branches are labeled in FIG. 1. The resistive branch corresponds to the regime in which the current passing through the material is a weak function of, and proportional to, the applied voltage across the material. This branch generally exhibits a smaller slope in the I-V plot than the conductive branch and often appears as a nearly horizontal line in the first and third quadrants of FIG. 1. The conductive branch, also referred to as the "dynamic" or "dynamic on" state of the material or device, corresponds to the regime in which the current passing through the material is less impeded and flows more easily under the voltage applied across the material. This branch exhibits a large slope in the I-V plot and often appears as a nearly vertical line in the first and third quadrants of FIG. 1.

The slopes of the resistive and conductive branches shown in FIG. 1 are illustrative and not intended to be limiting, the actual slopes may depend on the chemical composition or physical state of the chalcogenide material, device geometry, circuit configuration, series resistances, and electrical contacts. The slope of the resistive branch, for example, may be greater or lesser than the slope indicated in FIG. 1 and will vary depending on whether the chalcogenide material is in a crystalline or amorphous state. The difference between the threshold voltage and holding voltage may also be greater or lesser than indicated in FIG. 1. Although the threshold voltage is normally greater than the holding voltage, in some devices the threshold voltage and holding voltage may be similar in magnitude. In some devices, the threshold current and holding current may also be similar in magnitude. Since the conductivity of the chalcogenide material in the conductive branch is typically higher than the conductivity of the surrounding contacts or circuitry, the slope of the conductive branch is often controlled by resistances in series with the chalcogenide material. When device conditions are such that the chalcogenide material is described by a point on the resistive branch of the I-V curve, the chalcogenide material or device may be said to be in a resistive state. When device conditions are such that the chalcogenide material is described by a point on the conductive branch of the I-V curve, the chalcogenide material or device may be said to be in a conductive state.

The switching properties of the chalcogenide material are shown in FIG. 1. We begin with a device that has no voltage applied across it. When no voltage is applied across the chalcogenide material, the material is in a resistive state and no current flows. This condition corresponds to the origin of the I-V plot shown in FIG. 1. The chalcogenide material remains in a resistive state as the applied voltage is increased, up to a threshold voltage (labeled $V_t$ in the first quadrant of FIG. 1). The slope of the I-V curve for applied voltages between 0 and $V_t$ is small in magnitude and indicates that the chalcogenide material has a relatively high electrical resistance. The high resistance implies low electrical conductivity and as a result, the current flowing through the material increases only weakly as the applied voltage is increased. Since the current through the material is very low, the resistive state of the chalcogenide may be referred to as the OFF state of the material (or device). The conductive state of the chalcogenide may be referred to as the ON state of the material (or device) since the current through a device in the conductive state is high and increases significantly with increasing applied voltage.

When the applied voltage equals or exceeds the threshold voltage, the chalcogenide material transforms (switches) from the resistive branch to the conductive branch of the I-V curve. The switching event occurs rapidly and is depicted by the dashed line in FIG. 1. Upon switching, the device voltage decreases significantly and the device current becomes much more sensitive to changes in the device voltage. The chalcogenide material remains in the conductive branch as long as a minimum current, labeled $I_h$ in FIG. 1, is maintained. We refer to $I_h$ as the holding current and the associated voltage $V_h$ as the holding voltage of the device. If the device conditions after switching are changed so that the current becomes less than $I_h$, the material normally returns to the resistive branch of the I-V plot and requires subsequent application of a voltage greater than the threshold voltage to resume operation in the conductive branch. If the current is only momentarily (a time less than the recovery time of the chalcogenide material) reduced below $I_h$, the conductive state of the chalcogenide material may be recovered upon restoring the current to or above $I_h$. The recovery time of chalcogenide materials has been discussed in the article "Amorphous Semiconductors for Switching, Memory, and Imaging Applications", IEEE Transactions on Electron Devices, vol. ED-20, p. 91-105 (1973) by S. R. Ovshinsky and H. Fritzsche; the disclosure of which is incorporated by reference herein.

The switching effect of the instant devices originates from a transformation of the chalcogenide material from a resistive state to a conductive state upon application of a threshold voltage, $V_{th}$. According to one model of the switching transformation, application of the threshold voltage causes the formation of a conductive channel or filament within the chalcogenide material. At the threshold voltage, the electric field experienced by the material is sufficiently high to induce a breakdown or avalanche effect whereby electrons are removed from atoms to form a highly conductive, plasma-like filament of charge carriers. Rather than being bound to atoms, some electrons become unbound and highly mobile. As a result, a conductive channel or filament forms. The conductive filament constitutes a conductive volume within the otherwise resistive chalcogenide material. The conductive filament extends through the chalcogenide material between the device terminals and provides a low resistance pathway for electrical current. Portions of the chalcogenide material outside of the filament remain resistive. Since electric current traverses the path of least resistance, the presence of a conductive filament renders the chalcogenide material conductive. The creation of a conductive filament is the event that underlies the switching of the chalcogenide material from a resistive state to a conductive state.

The conductive filament is maintained between the device terminals as long as the device current remains at or above the holding current. A conductive filament is present for all points along the conductive branch, but the cross sectional area of the filament differs for different points along the conductive branch. Depending on operating conditions within the conductive branch, the filament can be narrow or wide. As the applied voltage is increased along the conductive branch, the cross section of the filament is enlarged as the applied voltage is increased. The enlarged filament indicates that a greater volume of the chalcogenide material exhibits high conductivity. When the filament reaches the dimensions of the pore, it can no longer expand and the device resistance increases (beginning at points A in FIG. 1). Due to the increased fractional conversion of the phase-change material to the highly conductive dynamic state through filament expansion, the chalcogenide material can support increasingly higher current in the conductive state as the applied voltage is increased. Variations of the voltage applied to a chalcogenide material operating in the conductive branch modify the width or thickness of the filament in directions lateral to the direction of current flow. The net effect of varying the applied voltage of a chalcogenide material operating in the conductive branch is to provide a variable and controlled amount of heating in order to ultimately modify the resulting volume fractions of the crystalline and amorphous portions. Such modifications enable control over the resistance of the phase-change material through variations in the relative proportions of crystalline and amorphous phase regions in the structural state of the chalcogenide material.

When the chalcogenide material is initially in the set state, the switching event shown in FIG. 1 is not observed. Instead, the I-V response exhibits a monotonic increase in current with increasing voltage. The I-V response of a material in the set state merges with the conductive branch (dynamic on state) shown in FIG. 1 for a device initially in the reset state. Mixed crystalline-amorphous states generally exhibit a switching event, but at voltages below the threshold voltage observed for the reset state. A progressive decrease in the voltage at which switching occurs is observed as the crystalline phase volume fraction increases from the reset state to the set state. All of the states, however, share a common dynamic on state.

Chalcogenide materials of many chemical compositions undergo the foregoing switching effect. Representative chalcogenide materials are those that include one or more elements from column VI of the periodic table (the chalcogen elements) and optionally one or more chemical modifiers from columns III, IV or V. One or more of S, Se, and Te are the most common chalcogen elements included in the active material of the instant devices. The chalcogen elements are characterized by divalent bonding and the presence of lone pair electrons. The divalent bonding leads to the formation of chain and ring structures upon combining chalcogen elements to form chalcogenide materials and the lone pair electrons provide a source of electrons for forming a conducting filament. Trivalent and tetravalent modifiers such as Al, Ga, In, Ge, Sn, Si, P, As and Sb enter the chain and ring structures of chalcogen elements and provide points for branching and crosslinking. The structural rigidity of chalcogenide materials depends on the extent of crosslinking and leads to a broad classification of chalcogenide materials, according to their ability to undergo crystallization or other structural rearrangements, into one of two types: threshold switching materials and phase-change (or memory) materials.

Both types of chalcogenide materials display the switching behavior shown in FIG. 1, but differ in their structural response to filament formation. The threshold switching materials generally possess a higher concentration of modifiers and are more highly crosslinked than the phase-change materials. They are accordingly more rigid structurally. Threshold switching materials are amorphous and show little or no tendency to crystallize because the atomic rearrangements required to nucleate and grow a crystalline phase are inhibited by the rigidity of the structure. Threshold switching materials do not undergo a crystallization transformation during switching and remain amorphous upon removing the applied voltage after switching.

Phase-change chalcogenide materials, on the contrary, are lightly crosslinked and more easily undergo full or partial crystallization. An amorphous phase-change material undergoes filament formation in the presence of a threshold voltage as described in FIG. 1 hereinabove. Once in the conductive branch, however, the phase-change material may undergo nucleation and growth of a crystalline phase due to Joule heating. The volume fraction of the crystalline phase depends on the magnitude and time of the current passing through the phase-change material. If formed, the crystalline phase is retained upon removing the applied voltage after switching. Through appropriate selection of device operating conditions, the amorphous-crystalline transformation of chalcogenide phase-change memory materials becomes reversible over many cycles. Chalcogenide memory materials have been discussed in U.S. Pat. Nos. 5,166,758; 5,296,716; 5,534,711; 5,536,947; 5,596,522; and 6,087,674; the disclosures of which are hereby incorporated by reference.

Figure 2:
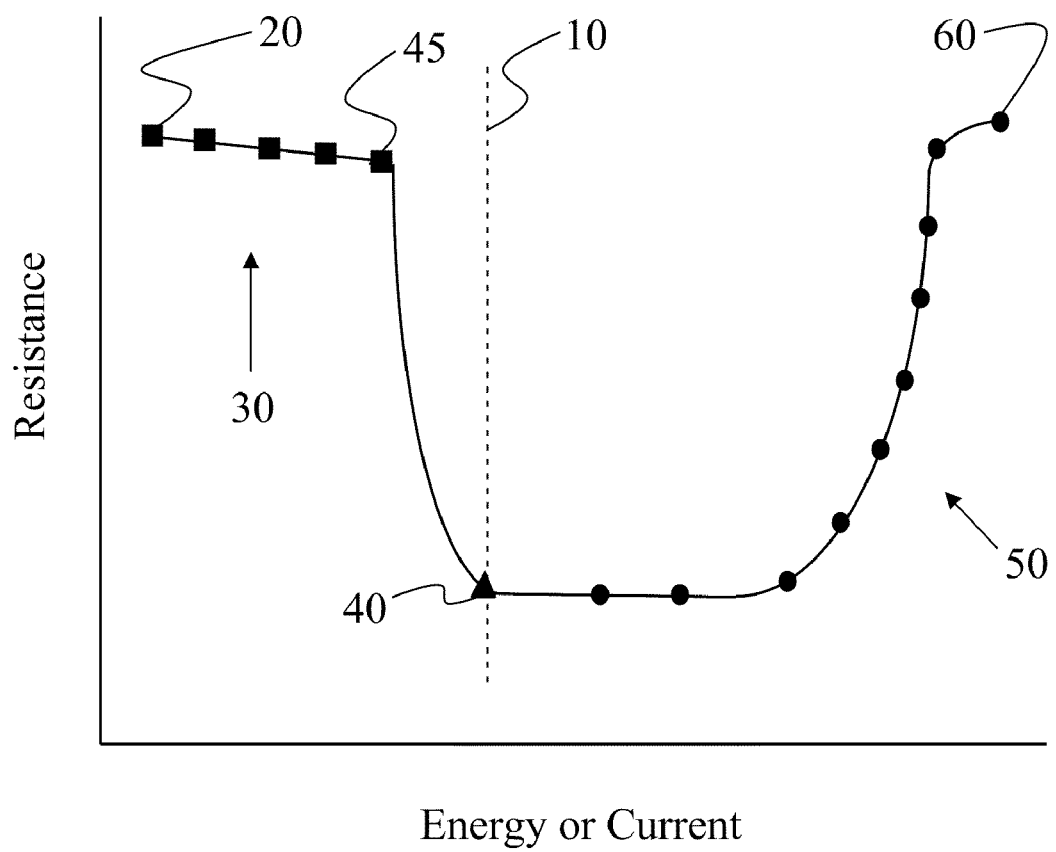
FIG. 2 is an illustrative Resistance vs. Energy/Current plot for a chalcogenide phase-change material.

The R-I response is a meaningful depiction of the characteristics of the chalcogenide phase-change memory devices and provides a representation of the effect of structural transformations associated with the crystalline-amorphous phase-change process on electrical properties. A representative depiction of the electrical resistance (R) of a chalcogenide memory device as a function of electrical energy or current pulse magnitude (Energy/Current) is presented in FIG. 2 for a device in which the chalcogenide material begins in the reset state (discussed below). FIG. 2 may generally be referred to as a resistance plot.

The resistance plot includes two characteristic response regimes of the device to electrical energy. The regimes are approximately demarcated with the vertical dashed line 10 shown in FIG. 2. The regime to the left of the line 10 may be referred to as the accumulating regime of the chalcogenide material. The accumulation regime is distinguished by a nearly constant or gradually varying electrical resistance with increasing electrical energy until a highly conducting state is reached. In most cases there is a region where device temperatures favor crystalline growth and when a percolation path forms, a pronounced resistance drop is observed for the device. The accumulation regime extends, in the direction of increasing energy, from the leftmost point 20 of the resistance plot, through a plateau region (generally depicted by 30) corresponding to the range of points over which the resistance variation is small or gradual to the set point or state 40 that follows an abrupt decrease in electrical resistance. The plateau 30 may be horizontal or sloping.

The left side of the resistance plot is referred to as the accumulating regime because the structural state of the chalcogenide material cumulatively evolves as energy is applied. The fractional crystallinity of the structural state correlates with the total accumulation of applied energy. The leftmost point 20 corresponds to the structural state in the accumulating regime having the lowest fractional crystallinity and may be referred to as the reset state. This state may be fully amorphous or may be primarily amorphous with some degree of crystalline content. As energy is added, the chalcogenide material progresses among a plurality of partially-crystalline states with increasing fractional crystallinity along the plateau 30. Selected accumulation states (structural states in the accumulation region) are marked with squares in FIG. 2.

Upon accumulation of a sufficient amount of applied energy, the fractional crystallinity of the chalcogenide material increases sufficiently to effect a setting transformation characterized by a dramatic decrease in electrical resistance and stabilization of the set state 40. The structural states in the accumulation regime may be referred to as accumulation states of the chalcogenide material. Structural transformations in the accumulating regime are unidirectional in the sense that they progress in the direction of increasing applied energy within the plateau region 30 and are reversible only by first driving the chalcogenide material through the set point 40 and resetting (melting and quenching the device). Once the reset state is obtained, lower amplitude current pulses can be applied and the accumulation response of the chalcogenide material can be retraced. It is possible to reversibly transform between the set and reset states over multiple cycles of operation.

While not wishing to be bound by theory, it is the believed that the addition of energy to a chalcogenide material in the accumulating regime leads to an increase in fractional crystallinity through the nucleation of new crystalline domains or growth of existing crystalline domains or a combination thereof. It is further believed that the electrical resistance varies only gradually along the plateau 30, despite the increase in fractional crystallinity, because the crystalline domains form or grow in relative isolation of each other so as to prevent the formation of a contiguous crystalline network that spans the chalcogenide material between the two device electrodes. This type of crystallization may be referred to as sub-percolation crystallization.

The setting transformation coincides with a percolation threshold in which a contiguous, interconnected crystalline network forms within the chalcogenide material and bridges the space between the two electrodes of the device. Such a network may form, for example, when crystalline domains increase sufficiently in size to impinge upon neighboring domains. Since the crystalline phase of chalcogenide materials is more conductive and less resistive than the amorphous phase, the percolation threshold corresponds to the formation of a contiguous low resistance conductive pathway through the chalcogenide material. As a result, the percolation threshold is marked by a dramatic decrease in the resistance of the chalcogenide material. The leftmost point 20 of the accumulation regime may be an amorphous state or a partially-crystalline state lacking a contiguous crystalline network. Sub-percolation crystallization commences with an initial amorphous or partially-crystalline state and progresses through a plurality of partially-crystalline states having increasingly higher fractional crystallinities until the percolation threshold is reached and the setting transformation occurs.

The regime to the right of the line 10 of FIG. 2 may be referred to as the direct overwrite regime. The direct overwrite regime extends from the set state 40 through a plurality of intermediate states (generally depicted by 50) to a reset point or state 60. The various points in the direct overwrite regime may be referred to as direct overwrite states of the chalcogenide material. Selected direct overwrite states are marked with circles in FIG. 2. Structural transformations in the direct overwrite regime may be induced by applying an electric current or voltage pulse to a chalcogenide material. In FIG. 2, an electric current pulse is indicated. In the direct overwrite regime, the resistance of the chalcogenide material varies with the magnitude of the applied electric pulse. The resistance of a particular direct overwrite state is characteristic of the structural state of the chalcogenide material, and the structural state of a chalcogenide material is dictated by the magnitude of the applied current pulse. The fractional crystallinity of the chalcogenide material decreases as the magnitude of the current pulse increases. The fractional crystallinity is highest for direct overwrite states at or near the set point 40 and progressively decreases as the reset state 60 is approached. The chalcogenide material transforms from a structural state possessing a contiguous crystalline network at the set state 40 to a structural state that is amorphous or substantially amorphous or partially-crystalline without a contiguous crystalline network at the reset state 60. The application of current pulses having increasing magnitude has the effect of converting portions of the crystalline network into an amorphous phase and ultimately leads to a disruption or interruption of contiguous high-conductivity crystalline pathways in the chalcogenide material between the electrodes. As a result, the resistance of the chalcogenide material increases as the magnitude of an applied current pulse increases in the direct overwrite region.

In contrast to the accumulating region, structural transformations that occur in the direct overwrite region are reversible and bi-directional. As indicated hereinabove, each state in the direct overwrite region may be identified by its resistance and an associated current pulse magnitude, where application of the associated current pulse magnitude induces changes in fractional crystallinity that produce the particular resistance state. Application of a subsequent current pulse may increase or decrease the fractional crystallinity of an existing resistance state of the chalcogenide material. If the subsequent current pulse has a higher magnitude than the pulse used to establish the existing state, the fractional crystallinity of the chalcogenide material decreases and the structural state is transformed from the existing state in the direction of the reset state along the direct overwrite resistance curve. Similarly, if the subsequent current pulse has a lower magnitude than the pulse used to establish the existing state, the fractional crystallinity of the chalcogenide material increases and the structural state is transformed from the existing state in the direction of the set state along the direct overwrite resistance curve.

The direct overwrite states of the chalcogenide material may be used to define memory states of a memory device. Most commonly, the memory devices are binary memory devices that utilize two of the direct overwrite states as memory states, where a distinct data value (e.g. "0" or "1") is associated with each state. Each memory state thus corresponds to a distinct structural state of the chalcogenide material and readout or identification of the state can be accomplished by measuring the resistance of the material (or device) since each structural state is characterized by a distinct resistance value. The operation of transforming a chalcogenide material to the structural state associated with a particular memory state may be referred to herein as programming the chalcogenide material, writing to the chalcogenide material or storing information in the chalcogenide material.

To facilitate readout and minimize readout error, it is desirable to select the memory states of a binary memory device so that the contrast in resistance of the two states is large. Typically the set state (or a state near the set state) and the reset state (or a state near the reset state) are selected as memory states in a binary memory application. The resistance contrast depends on details such as the chemical composition of the chalcogenide, the thickness of the chalcogenide material in the device and the geometry of the device. For a layer of phase-change material having the composition $Ge_{22}Sb_{22}Te_{56}$, a thickness of ~600 Å, and pore diameter of below ~0.1 μm in a typical two-terminal device structure, for example, the resistance of the reset state is ~100-1000 kΩ and the resistance of the set state is under ~10 kΩ. Phase-change materials in general show resistances in the range of ~100 kΩ to ~10,000 kΩ in the reset state and resistance of ~0.5 kΩ to ~50 kΩ in the set state. In the preferred phase-change materials, the resistance of the reset state is at least a factor of two, and more typically an order of magnitude or more, greater than the resistance of the set state.

Figure 3:
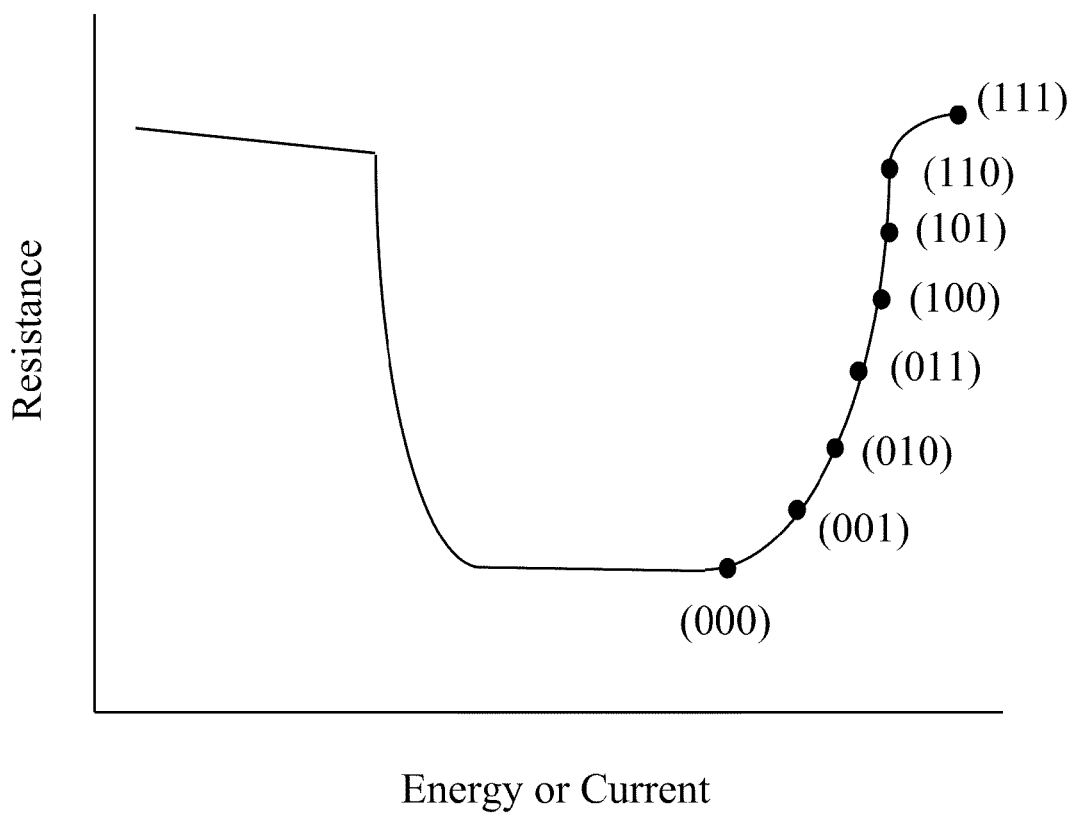
FIG. 3 depicts an assignment of resistance values to memory states of a multilevel memory device.

This invention seeks to extend the applicability of chalcogenide or phase-change materials beyond binary (single bit) memory applications to multilevel (non-binary or multiple bit) memory applications. The storage density of a multilevel chalcogenide or phase-change memory device improves as the number of memory states increases. Multilevel memory operation can be achieved by selecting three or more states of a phase-change memory device and associating a unique data value with each. Each of the three or more states corresponds to a distinct structural state of the chalcogenide, phase-change, or variable resistance material, and may be characterized by a distinct resistance value. Two bit operation can be achieved by selecting four states to serve as memory states, three bit operation can be achieved by selecting eight states to serve as memory states, etc. FIG. 3 shows an illustrative selection of eight states for use as memory states in a three-bit memory device. One assignment of data values to the different states is also shown, where the (000) state corresponds to the set state, the (111) state corresponds to the reset state, and a series of intermediate resistance states is included. Although not shown in FIG. 3, multilevel operation may also be achieved by defining states along the leftside accumulation regime and/or along the transition regime coinciding with the set transformation and is not limited to direct overwrite states.

To improve the storage density in a multilevel memory device, it is desirable to operate the memory material over as many states as possible. The number of memory states is controlled by the resistance interval between the set state and reset state, the resolution limit of the resistance measurement performed during the read operation, and the stability of the resistance values. A large resistance difference between the set and reset states provides a wide dynamic range of resistance over which operation of the memory device can occur. The resolution limit of the read resistance measurement imposes a practical limit on the spacing of resistance values associated with the different memory states. The resolution limit depends on read noise and circuit sense-amp resolution and imbalance. The resistance differential between adjacent memory states must be greater than the resolution of the read resistance measurement. Stable resistance values are needed to insure that programmed resistance values do not vary in time.

In current chalcogenide phase-change memory devices, the resistance contrast between the set and reset states is large (at least an order of magnitude) and the resolution of a resistance measurement is on the order of a few or so percent of the measured resistance value. The primary practical limitation in achieving reliable multilevel operation today is variability in the resistance of the memory states over time. Time variability of resistance may be referred to herein as "resistance drift" or "drift". Drift is a common occurrence in chalcogenide phase-change materials and causes the resistance of the material to deviate (usually increase) from its programmed value. As indicated hereinabove, storing data in a chalcogenide memory device occurs by using energy to program the chalcogenide memory material to the structural state assigned to the data value. The resistance of the structural state is a representation of the data value and different data values are distinguished on the basis of resistance. When drift occurs, the programmed resistance deviates over time from its initial value. As a result, when the memory device is read at a later time, the resistance differs from the intended value and a misread of information may occur. The variation in resistance over time is spontaneous and occurs in the absence of any post-programming electrical stimulation.

Experimentally, it has been observed that drift normally leads to an increase in resistance over time. The variation of resistance with time is commonly modeled empirically with the following power law relation:

$$R(t) = R_0 t^d$$

where $R(t)$ is the resistance at time t, $R_0$ is the resistance measured 1 second (or other fixed short time) following the programming pulse, t is time, and d is the drift exponent (which may also be referred to herein as a drift coefficient).

Figure 4:
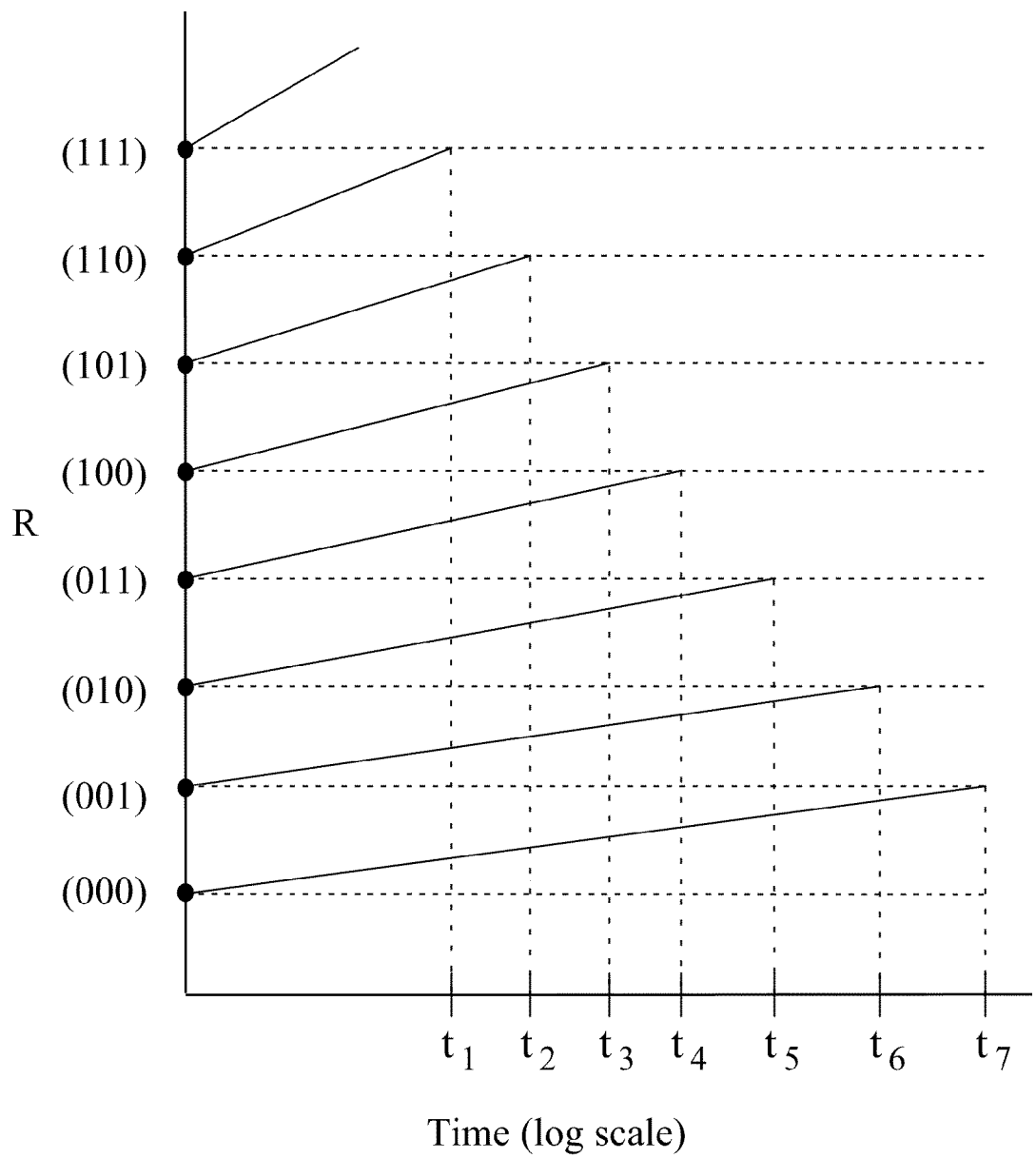
FIG. 4 is a schematic depiction of resistance drift for memory states of a multilevel memory device.

FIG. 4 shows a schematic depiction of resistance drift for the eight states identified in the three-bit memory device of FIG. 3. The initial (programmed) resistance of each state is plotted on the ordinate axis and a representation of the evolution of the resistance of each state with time is shown. The time axis is presented on a logarithmic scale and the resistance drift for each state is shown as a linear relation in accordance with the power law form presented above. The slope (drift exponent) of the power law has been arbitrarily selected for each of the states for illustration purposes. In the depiction shown in FIG. 4, consistent with frequent experimental observation, the drift exponent has been chosen to be higher for higher resistance states than for lower resistance states.

The negative ramifications of drift for multilevel memory devices can be understood from FIG. 4. If the initial resistance of a particular programmed memory state drifts sufficiently to coincide with the resistance of a different memory state, a read of the resistance provides a false indication of the initial/intended data value stored in the device. Suppose, for example, that the resistance of the (000) state shown in FIG. 4 is 5 kΩ and that the remaining states are spaced apart by 50 kΩ intervals so that the resistance of state (001) is 55 kΩ, the resistance of state (010) is 105 kΩ etc. If the material is programmed into a particular memory state and the resistance of that state drifts by 50 kΩ, a read of the resistance of the state provides a result that indicates that the device is in a memory state adjacent to the one in which the device was actually programmed. In the example of FIG. 4, the resistance of the (110) state drifts upward in resistance by 50 kΩ at time $t_1$. If the device is read at time $t_1$, the measured resistance corresponds to the resistance of the (111) state and leads the user to erroneously conclude that the (111) data value was stored in the device instead of the (110) data value. Similar errors in determining the programmed data value occur for state (101) at time $t_2$, state (100) at time $t_3$, etc. Depending on the time elapsed since programming and the drift coefficient, the resistance of a particular programmed state may drift beyond the adjacent memory state to higher memory states.

In the case of a binary memory, where the set state (e.g. (000)) and reset state (e.g. (111)) are selected as the memory state, drift presents no practical difficulty because the drift exponent of the set state is either non-existent or so small as to preclude the possibility of confusing the set state with the reset state. (Drift of the reset state simply results in a desirable increase in read margin). As the number of memory states increases and the resistance interval between states decreases, however, drift becomes of great practical concern.

The instant invention seeks to exploit the low drift characteristics of crystalline states for multilevel memory devices. As indicated in FIG. 3, current multilevel cell programming schemes contemplate use of three or more states selected from among the direct overwrite states of a phase-change materials. The selected states include the set state, the reset state, and one or more mixed crystalline-amorphous states having resistances intermediate between the set resistance and the reset resistance. Of the states selected for multilevel operation, all but the set state include appreciable amorphous phase content. Since the presence of amorphous phase content in the programming state is believed to underlie drift, the instant inventors reason that programming schemes that include multiple crystalline states should attenuate the effect of drift on the stability of the programmed states and should better enable multilevel operation by preventing or delaying overlap of adjacent states with time.

The programming schemes of the instant invention utilize two or more crystalline programming states. As used herein, "crystalline programming state" refers to a programming state whose electrical resistance is controlled primarily by the crystalline phase content of the phase-change material. When a device is in a crystalline programming state, the phase-change material includes a contiguous crystalline network that spans the distance between device electrodes. The prevalence of the contiguous crystalline network is sufficient enough to preclude any meaningful contribution of an amorphous phase to the measured electrical resistance of the device. Although the physical state of a phase-change material in a crystalline programming state is expected to include primarily crystalline phase content, it may also include ancillary amorphous phase content. The set state described hereinabove is an illustrative crystalline programming state.

Similarly, "amorphous programming state" refers to a programming state whose electrical resistance is controlled primarily by the amorphous phase content of the phase-change material. When a device is in an amorphous programming state, the phase-change material includes a contiguous amorphous network that spans the distance between device electrodes and precludes the existence of a contiguous crystalline network that spans the distance between device electrodes. The absence of the contiguous crystalline network is sufficient enough to preclude any substantial contribution of a crystalline phase to the measured electrical resistance of the device. Although the physical state of a phase-change material in an amorphous programming state is expected to include primarily amorphous phase content, it may also include ancillary crystalline phase content. The ancillary crystalline phase may consist of dispersed, isolated regions of crystalline material (e.g. microcrystalline regions). The reset state described hereinabove is an illustrative amorphous programming state.

A "mixed crystalline-amorphous programming state" refers to a programming state whose electrical resistance reflects appreciable contributions from both crystalline phase content and amorphous phase content. The prevalence of crystalline phase content and amorphous phase content is sufficient so that each has an appreciable influence on the measured electrical resistance of the device. The phase-change material may, but need not, include a contiguous crystalline network. If present, however, the contiguous crystalline network is insufficient in cross-section or volume fraction to support the full current load passing between electrodes. The relative proportions and/or spatial configuration of crystalline phase content and amorphous phase content in a mixed crystalline-amorphous programming state is such that the current flowing between electrodes must pass through appreciable amounts of crystalline phase content and amorphous phase content. The measured resistance of a mixed crystalline-amorphous programming state is accordingly intermediate between the resistance of a crystalline programming state and an amorphous programming state.

The instant invention provides programming schemes that utilize two or more crystalline programming states, each of which consists essentially of or includes one or more distinct crystalline phases, where each crystalline phase is characterized by a distinct crystallographic unit cell structure. As is known in the art of crystallography, the structures of crystalline solids can be classified on the basis of space groups and unit cells (e.g. cubic, trigonal, hexagonal, tetragonal, orthorhombic, monoclinic, and triclinic). The instant inventors have shown that it is possible to stabilize two or more crystalline phases of phase-change compositions through control over the programming conditions and have further shown that the different crystalline phases are resolved in resistance and exhibit little or no resistance drift. The instant invention accordingly provides programming schemes for multilevel operation that incorporate a plurality of crystalline programming states.

Figure 5:
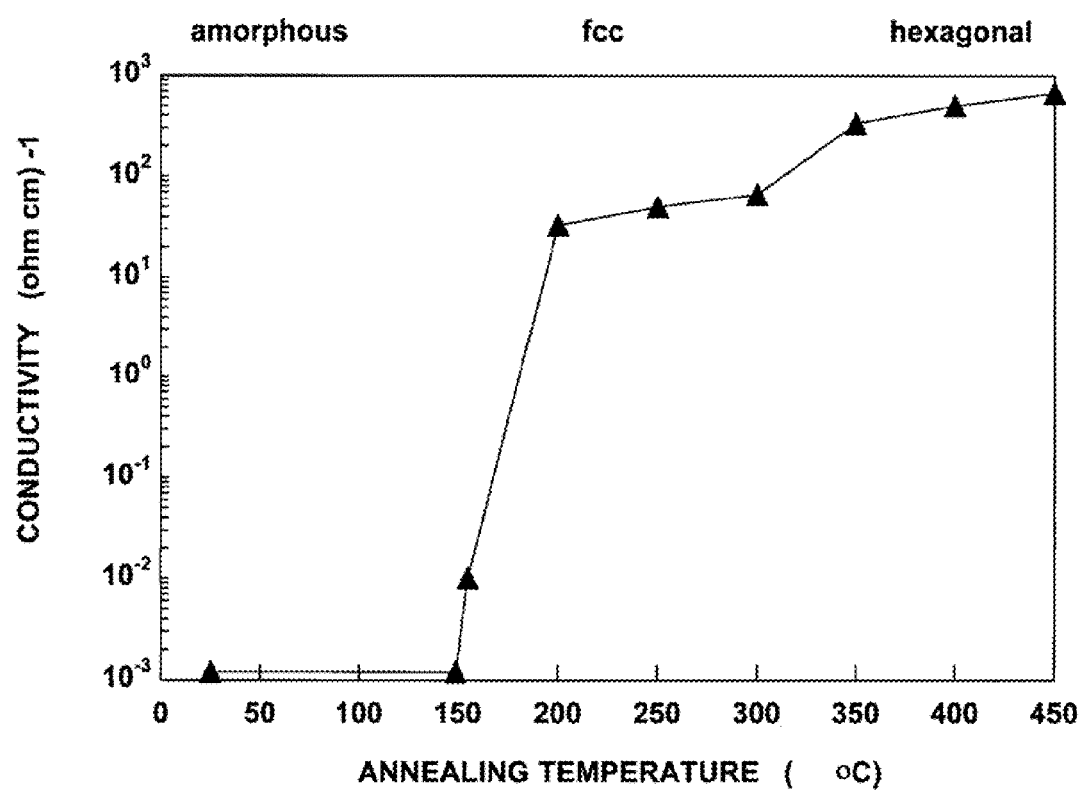
FIG. 5 depicts attainment of the amorphous, face-centered cubic, and hexagonal phases of $Ge_2Sb_2Te_5$ through temperature annealing.

In co-pending U.S. patent application Ser. No. 11/032,345 ("'345 application"), one of the instant inventors showed that a phase-change material having the composition $Ge_2Sb$—$_2Te_5$ can transition from a more resistive face-centered cubic (fcc) crystalline phase to a less resistive hexagonal crystalline phase under the influence of Joule heating. FIG. 3 from the '345 application illustrates the effect of annealing temperature on the conductivity and physical state of $Ge_2Sb_2Te_5$ and is reproduced in FIG. 5 herein. The annealing temperature data indicate that the low conductivity (~$10^{-3}$ $\Omega^{-1}cm^{-1}$) amorphous phase transitions to a higher conductivity (~30-60 $\Omega^{-1}cm^{-1}$) face-centered cubic crystalline phase at a temperature of ~200° C. and that the face-centered cubic crystalline phase further transitions to a still higher conductivity (~500-2000 $\Omega^{-1}cm^{-1}$) hexagonal crystalline phase at a temperature of ~350° C.

The method of the instant invention generally permits programming between three or more states that are resolvable on the basis of resistance where at least two of the programming states are crystalline states. In one embodiment, the method utilizes two or more crystalline states and an amorphous or partially amorphous state as programming states. The two or more crystalline programming states are distinguishable on the basis of resistance and exhibit little or no drift in resistance over time. The amorphous or partially amorphous programming state has a much higher resistance than any of the crystalline programming states and may exhibit a drift in resistance over time. The resistance drift of the amorphous or partially amorphous state does not, however, lead to ambiguity in identifying programming states. In one embodiment, drift causes the resistance of the amorphous or partially amorphous state to increase in time at a rate that increases the resistance contrast between the amorphous or partially amorphous state and any of the crystalline programming states. As a result, overlapping of states is avoided.

In one embodiment, the programming method utilizes at least two crystalline programming states and one amorphous programming state. In another embodiment, the programming method utilizes at least two crystalline programming states and a mixed crystalline-amorphous programming state. In still another embodiment, the programming method utilizes at least three crystalline programming states. Additional crystalline, mixed crystalline-amorphous, and amorphous states may be included in the method along with the at least two crystalline states to obtain additional programming states. In one embodiment, the method includes four or more programming states. In another embodiment, the method includes six or more programming states. In a further embodiment, the method includes eight or more programming states.

The crystalline programming states may be different crystalline phases of a phase-change material. In one embodiment, the at least two crystalline programming states include one state that is predominantly face-centered cubic and a second state that is predominantly hexagonal, where the resistances of the face-centered cubic and hexagonal states are distinguishable. In another embodiment, the at least two crystalline programming states include one state that is predominantly face-centered cubic and one state that is a mixture of face-centered cubic and hexagonal crystalline phases. In still another embodiment, the at least two crystalline programming states include one state that is predominantly hexagonal and one state that is a mixture of face-centered cubic and hexagonal crystalline phases. In a further embodiment, the at least two crystalline programming states include one state that is predominantly face-centered cubic, one state that is a mixture of face-centered cubic and hexagonal crystalline phases, and one state that is predominantly hexagonal. Each of the foregoing may further include one or more amorphous or partially amorphous programming states.

The following examples present results showing the presence of multiple crystalline phases for a representative phase-change composition. The examples demonstrate that the crystalline phases are sufficiently resolved in resistance and possess sufficiently low resistance drift to be useful as programming states in a multilevel programming scheme.

Example 1

In this example, fabrication of the memory device used to obtain the experimental results described hereinbelow is described. The device structure was a standard two-terminal design that included $Ge_{32}Sb_{14}Te_{54}$ as the active material. $Ge_{32}Sb_{14}Te_{54}$ is a variable resistance composition drawn from the phase-change class of materials. As explained in the following examples, $Ge_{32}Sb_{14}Te_{54}$ can be stabilized in multiple crystalline programming states through electrical programming. The multiple crystalline programming states include a face-centered cubic phase, a hexagonal phase, and a series of crystalline phases that include a mixture of the face-centered cubic and hexagonal phases in varying proportions. $Ge_{32}Sb_{14}Te_{54}$ can also be stabilized in an amorphous programming state and a plurality of mixed crystalline-amorphous programming states.

Figure 6:
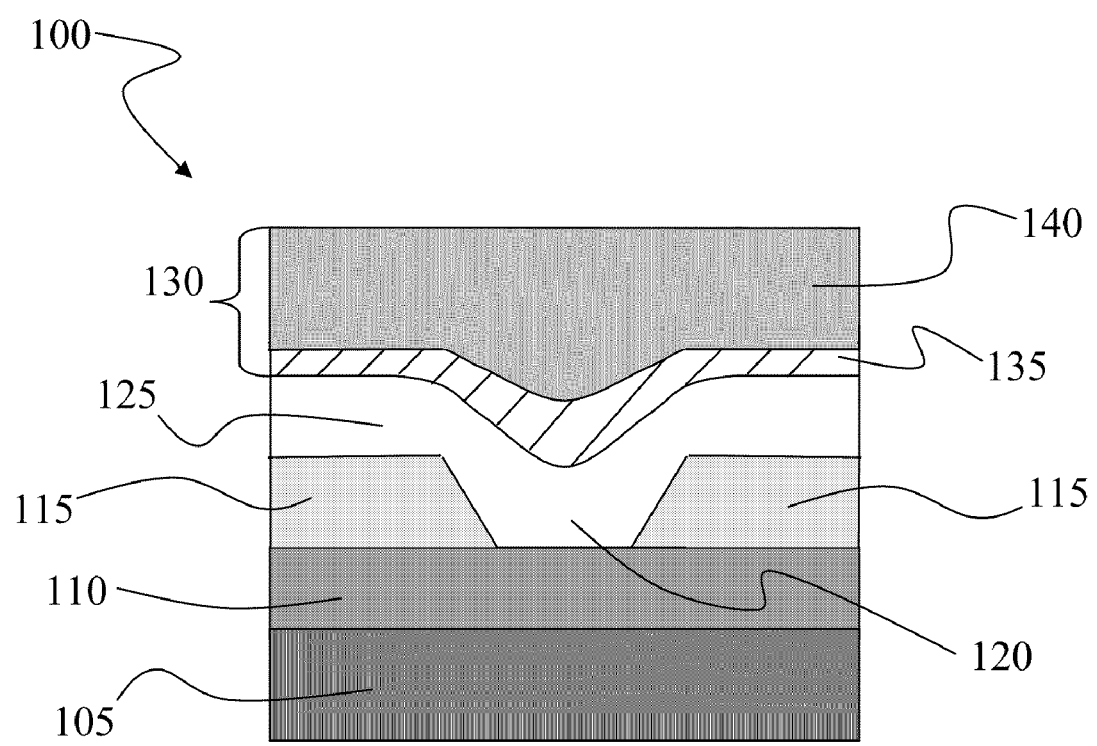
FIG. 6 depicts a typical two-terminal variable resistance electrical memory device.

The device structure is schematically illustrated in FIG. 6. Device 100 includes substrate 105, lower electrode 110, and dielectric 115. Dielectric 115 included opening 120 in which phase-change material 125 was deposited. Upper electrode 130 was formed over phase-change material 125. Upper electrode 130 included Ti layer 135 and TiN layer 140. The thicknesses of Ti layer 135, and TiN layer 140 were ~20 Å and ~600 Å, respectively. Lower electrode 110 was formed from titanium aluminum nitride (TiAlN). Dielectric 115 was silicon dioxide with a thickness of ~500 Å. The lateral dimension of opening 120 at the interface with lower electrode 110 was approximately 100 nm. Phase-change material 125 was prepared by an MOCVD (metalorganic chemical vapor deposition) process and had a thickness of ~750 Å. Several devices were fabricated and used in the tests described in Examples 2-4 hereinbelow. Similar results not described herein were also obtained for devices that incorporated a phase-change material of similar composition prepared by physical vapor deposition.

Example 2

In this example, the I-V (current vs. voltage) and R-I (resistance vs. current) characteristics of the device described in Example 1 are summarized. The I-V and R-I measurements were performed by applying a series of voltage pulses of increasing amplitude between upper electrode 130 and lower electrode 110. The initial voltage pulse had an amplitude of ~0.1 V and each successive pulse was increased in amplitude by ~0.1-0.2V up to a maximum voltage of ~7V. The voltage pulses had a duration of 500 ns. A fixed resistor of ~2 Kohms was placed in series with the pulse generator to serve as a current limiter. While each voltage pulse was applied, the current passing through the device was measured. After each voltage pulse was applied, the resistance of the device was measured. In this way, a current and resistance was obtained for each voltage pulse. The points were plotted to obtain the I-V relationship shown in FIG. 7 and the R-I relationship shown in FIG. 8. The process was repeated over several passes of operation to obtain a series of I-V and R-I curves that showed how the device characteristics evolved from an initial as-fabricated state. Data are presented for the first eight passes of operation.

Figure 7:
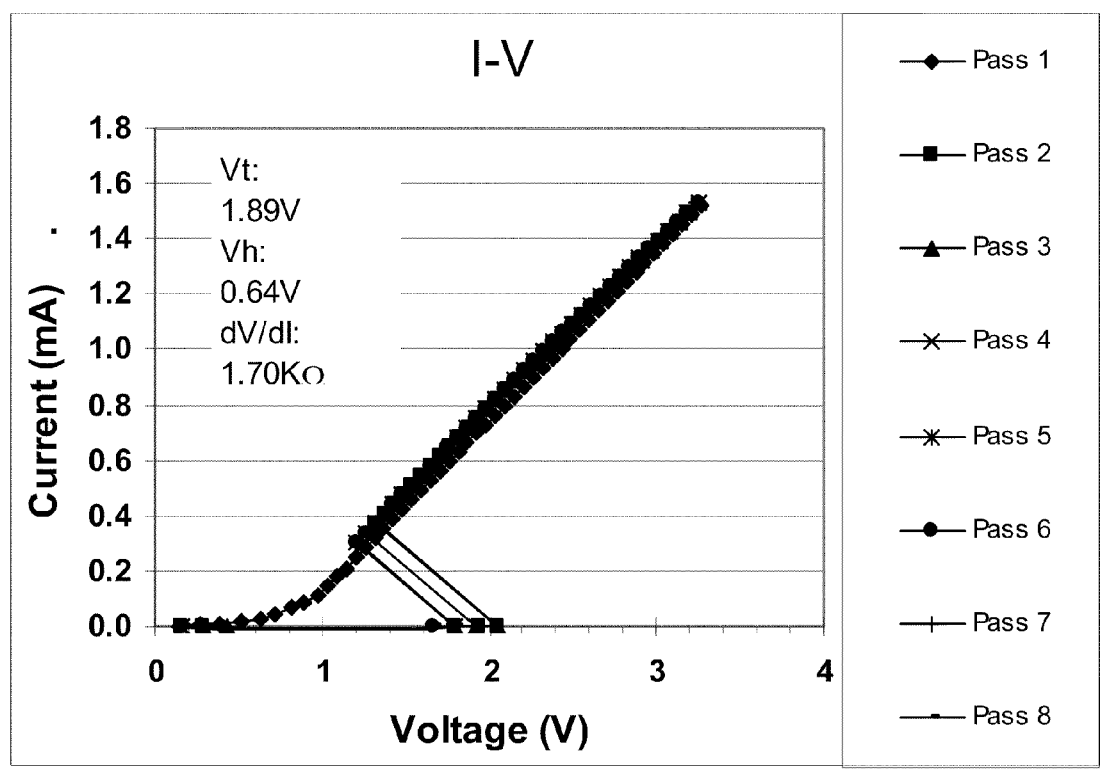
FIG. 7 shows the current-voltage characteristic of an electrical memory device that incorporates $Ge_{32}Sb_{14}Te_{54}$ as the active phase-change material.
Figure 8:
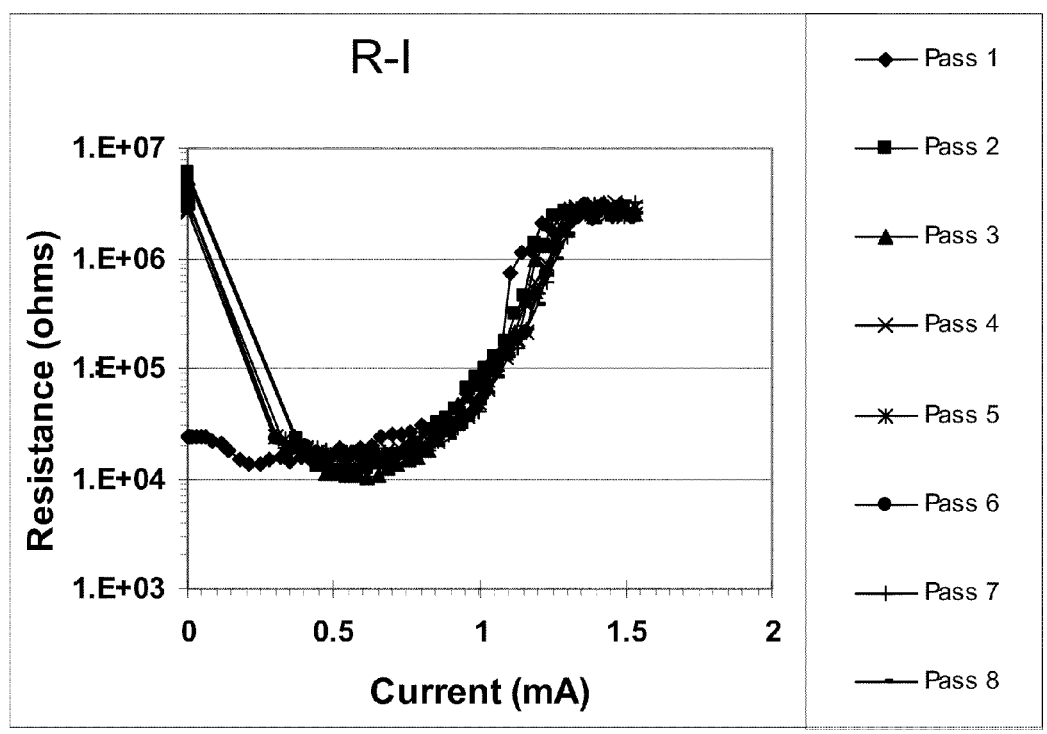
FIG. 8 shows the resistance-current characteristic of an electrical memory device that incorporates $Ge_{32}Sb_{14}Te_{54}$ as the active phase-change material.

The initial pass of operation was a forming cycle that began with a device in an as-fabricated state. The forming cycle exhibited no switching event in the I-V curve and exhibited an initial resistance of ~20 kΩ in the R-I plot. After the forming cycle, the I-V data of FIG. 7 show a switching event that stabilizes to a threshold voltage of ~1.9V. The R-I data of FIG. 8 indicate that after the forming cycle, the device cycles through a series of resistance states that include a set state, a reset state, and a series of intermediate resistance states as described hereinabove for FIG. 2.

The results of this example show that the composition $Ge_{32}Sb_{14}Te_{54}$ exhibits electrical characteristics consistent with phase-change memory operation. The following examples consider the range and characteristics of programming states available from the device.

Example 3

This example illustrates the effect of programming conditions on the resistance of the device described in Examples 1 and 2 hereinabove. More specifically, this example demonstrates that the characteristics of the electrical programming pulses can be varied to consistently stabilize a plurality of crystalline programming states. A programming experiment was completed in which the thermal environment of the phase-change material was varied through modification of the quench rate of the phase-change material.

The programming technique involved measurement of the device resistance after application of a two-pulse sequence. The first of the two pulses was a reset pulse having a voltage amplitude sufficient to melt the active phase-change material and a falltime that was sufficiently short to stabilize the phase-change device in its reset state. As noted hereinabove, the reset state is an amorphous programming state that lacks appreciable crystalline content. By decreasing the falltime of the pulse, the phase-change material was cooled at a rate sufficient to quench the material and prevent appreciable crystallization. The device was then subjected to a programming pulse having a fast risetime (steep leading edge) and the same voltage amplitude as the reset pulse, but a slower falltime (gradual trailing edge). After application of the programming pulse, the resistance of the device was measured and recorded. The experiment was repeated for a series of two-pulse sequences in which the falltime of the programming pulse was varied.

The two-pulse programming sequences of this example were designed to induce crystallization and stabilize crystalline phases of the phase-change material. As noted hereinabove, crystallization requires the active material to exist at a temperature between the crystallization temperature and melting temperature for a sufficiently long period of time to permit the structural rearrangements necessary to form an ordered structure from the melt phase. The two-pulse sequences of this example use the falltime of the programming pulse to regulate the rate of cooling of the active material. The amplitude of each programming pulse is sufficient to melt the active material. Programming pulses with a long falltime promote crystallization by insuring that the device exists at a temperature that permits crystallization for a sufficient time. Programming pulses with a sufficiently short falltime cause the active material to cool quickly and prevent it from existing at a temperature that permits crystallization for a sufficient time. Instead, the active material quenches to a state having a substantial amorphous content.

The objective of the programming scheme of this example is to cycle a device over a series of two-pulse programming sequences that use a common initial reset pulse and a second programming pulse whose falltime varies over a range of times. The instant inventors recognize that the time required for crystallization may vary for different crystalline phases and that the initial crystalline phase that may form during programming may be a metastable phase. By considering programming pulses with extended falltimes, the instant inventors have discovered that phase-change compositions can be stabilized in multiple crystalline phases and that programming schemes based on new crystalline phases can be devised.

Figure 9:
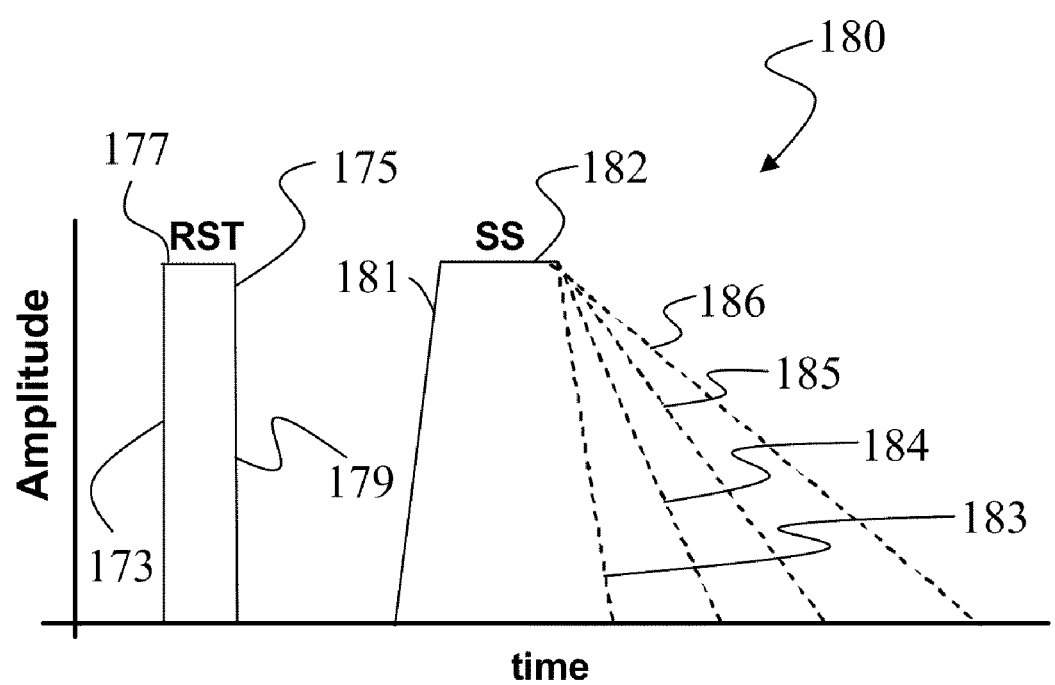
FIG. 9 depicts a two-pulse programming sequence that includes programming pulses having various falltimes.

The sequence of programming pulses used in this example is depicted more specifically in FIG. 9. The device was first transformed to an initial reset state using a reset pulse 175 having a leading edge 173 with a 3 ns risetime, a plateau 177 having a voltage amplitude of 7.5V and duration of 100 ns, and trailing edge 179 having a 3 ns falltime. The characteristics of reset pulse 175 were kept consistent throughout the experiments of this example. The series of programming pulses is generally indicated at 180. Each of the programming pulses included leading edge 181 having a 1 μs risetime, a plateau 182 having a voltage amplitude of 7.5V and duration of 2 μs, and a trailing edge having a falltime that was varied from short to long over the course of the experiment as indicated generally at 183-186 in FIG. 9. The first programming pulse included trailing edge 183 having a falltime of 100 ns. After application of the first programming pulse, the device resistance was measured and recorded. The experiment was then repeated using the same reset pulse and programming pulses with progressively increasing falltimes. Falltimes ranging from 100 ns to 9 μs were considered. The falltime was increased in increments of 20 ns over the repeated cycles of the programming sequence until the falltime increased to 5 μs. In subsequent cycles, the falltime of the programming pulse was increased in increments of 50 ns up to a maximum fall time of 9 μs. The resistance of the device was measured after each programming pulse and the device resistance was determined as a function of falltime. The experiment was repeated in a second trial.

Figure 10:
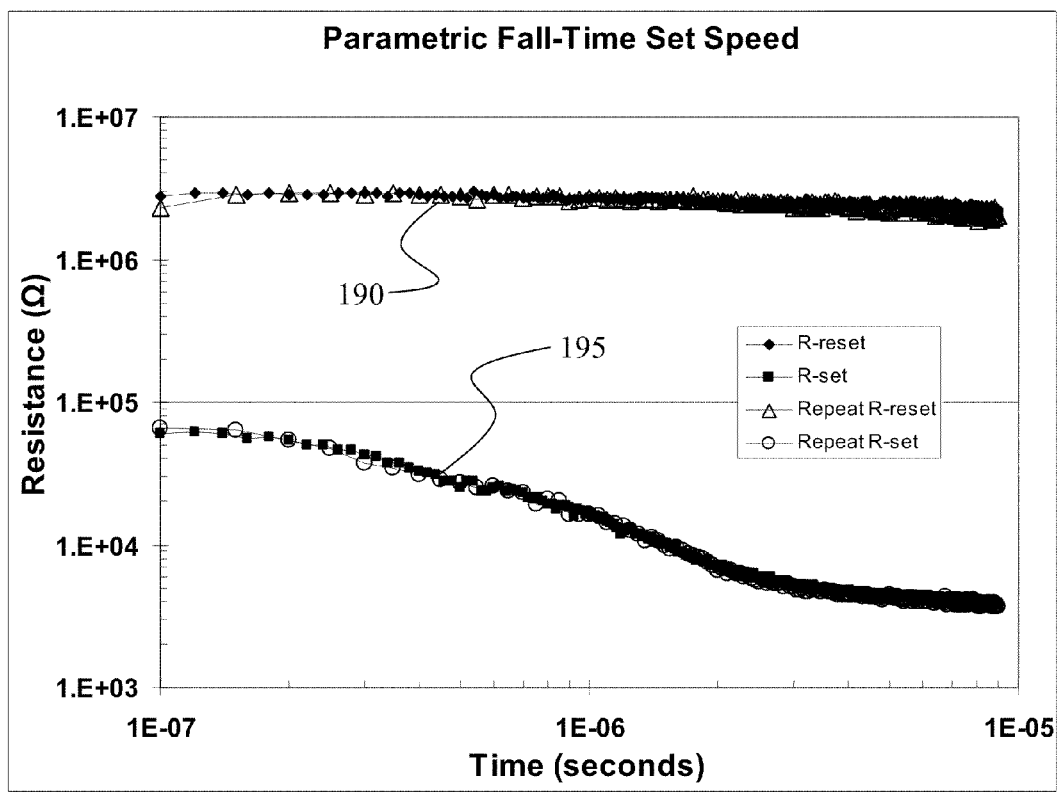
FIG. 10 shows the resistance of an electrical memory device that incorporates $Ge_{32}Sb_{14}Te_{54}$ as the active phase-change material as a function of the falltime of a programming pulse.

FIG. 10 shows the dependence of the device resistance on the falltime of the programming pulse. Data for both experimental trials are shown and highly reproducible results were observed. Upper curve 190 shows the resistance of the device after applying the initial reset pulse of each two-pulse programming sequence and lower curve 195 shows the resistance after applying the programming (second) pulse of each two-pulse programming sequence. The reset and programmed resistance for each programming sequence is plotted as a function of the falltime of the programming pulse. The results indicate that the reset resistance of the device was consistently ~2.5 MΩ and that the resistance of the device after applying the programming pulse decreased from ~60 kΩ when the programming pulse had a falltime of 100 ns to ~4 kΩ when the programming pulse had a falltime of 9 μs. The high resistance of the reset state is consistent with the primarily amorphous character expected for the reset state.

The ~60 kΩ device resistance observed after applying a programming pulse with a 100 ns falltime is much lower than the reset resistance and is consistent with a transformation of the device to a crystalline programming state. A 100 ns falltime is much longer than the 3 ns falltime used for the reset pulse and, based on the pronounced reduction in resistance observed in the data, is sufficient to induce crystallization. It is believed by the instant inventors that application of the programming pulse with a 100 ns falltime stabilizes the device in a crystalline programming state in which the phase-change material is in the face-centered cubic crystalline phase identified in the co-pending parent patent application Ser. No. 11/032,345. It is further believed that the crystalline phase consists essential of the face-centered cubic phase as the only crystalline phase and that no appreciable amorphous phase content is present. The 100 ns falltime of the programming pulse is believed to be sufficiently long to permit crystallization of the amorphous phase content and if present, any residual amorphous phase content would have no material effect on the device resistance. The instant inventors note that one could achieve a successful binary memory device by operating the material between the amorphous programming state (~2.5 MΩ resistance) and the face-centered cubic crystalline programming state (~60 kΩ resistance).

The data presented in FIG. 10 further indicate that when the falltime of the programming pulse was increased above 100 ns, an additional decrease in device resistance was observed. The device resistance was observed to stabilize at ~4 kΩ as the falltime of the programming pulse was increased above 4-5 μS. The instant inventors believe that the ~4 kΩ state of the device is a crystalline programming state in which the phase-change material is in the hexagonal crystalline phase identified in the co-pending parent patent application Ser. No. 11/032,345. It is further believed that the crystalline phase of the ~4 kΩ state of the device consists essentially of the hexagonal phase as the dominant crystalline phase.

The results of FIG. 10 indicate that variations in the falltime of the programming pulse enable stabilization of distinct crystalline programming states based on the face-centered cubic and hexagonal crystalline phases. When programmed to the face-centered cubic crystalline phase, the device resistance was ~60 kΩ and when programmed to the hexagonal crystalline phase, the device resistance was ~4 kΩ. The data indicate that the face-centered cubic crystalline programming state can be stabilized with programming pulses having falltimes in the range from ~100 ns–~180 ns and that the hexagonal crystalline programming state can be stabilized with programming pulses having falltimes in the range from ~5 μs–~9 μs. In the window of falltimes between ~180 ns and ~5 μs, the phase-change material exhibits a transformation from the face-centered cubic crystalline phase to the hexagonal crystalline phase and the physical state of the phase-change material is believed to consist of a mixture of the two crystalline phases in varying proportions. The data indicate that the initial formation of the lower resistance crystalline (hexagonal crystalline phase) requires a minimum programming pulse falltime of ~180 ns and that the hexagonal crystalline phase becomes more prevalent with increasing falltime. When the falltime exceeds ~5 μs, the phase-change material exists essentially entirely in the lowest resistance crystalline phase (believed to be hexagonal).

In summary, this example shows that multiple crystalline programming states can be stabilized in a phase-change material by controlling programming conditions. Distinct face-centered cubic and hexagonal crystalline phases could be stabilized through appropriate selection of programming conditions. In addition, a continuous range of mixed crystalline phase programming states was observed in which the relative proportions of the face-centered cubic and hexagonal crystalline phases varied continuously.

Example 4

The data presented in Example 3 indicated that the face-centered cubic crystalline phase, the hexagonal crystalline phase, and a series of mixed crystalline phase programming states could be reproducibly stabilized. The data further indicated that the different crystalline programming states were well-resolved in resistance. In this example, the feasibility of using the crystalline programming states for multilevel operation of a phase-change memory device is demonstrated. As noted hereinabove, overlap of programmed memory states arising from resistance drift currently limits the prospects of multilevel memory devices. This example presents the results of drift measurements performed for the reset state, a mixed amorphous-crystalline programming state, and several crystalline programming states.

The drift experiments were completed by first resetting the device and then programming it to a particular resistance state by applying a programming pulse having a particular falltime. Falltimes ranging from 10 ns to 9 μs were considered. After the device was programmed to a particular resistance state, an initial resistance was measured and the variation of the resistance with time was determined. The data were modeled with the power law formula described hereinabove to obtain a drift coefficient. The drift coefficient was then used to extrapolate the drift data to longer times to assess the feasibility of developing a multilevel programming scheme that includes the crystalline programming states identified in this invention.

Figure 11:
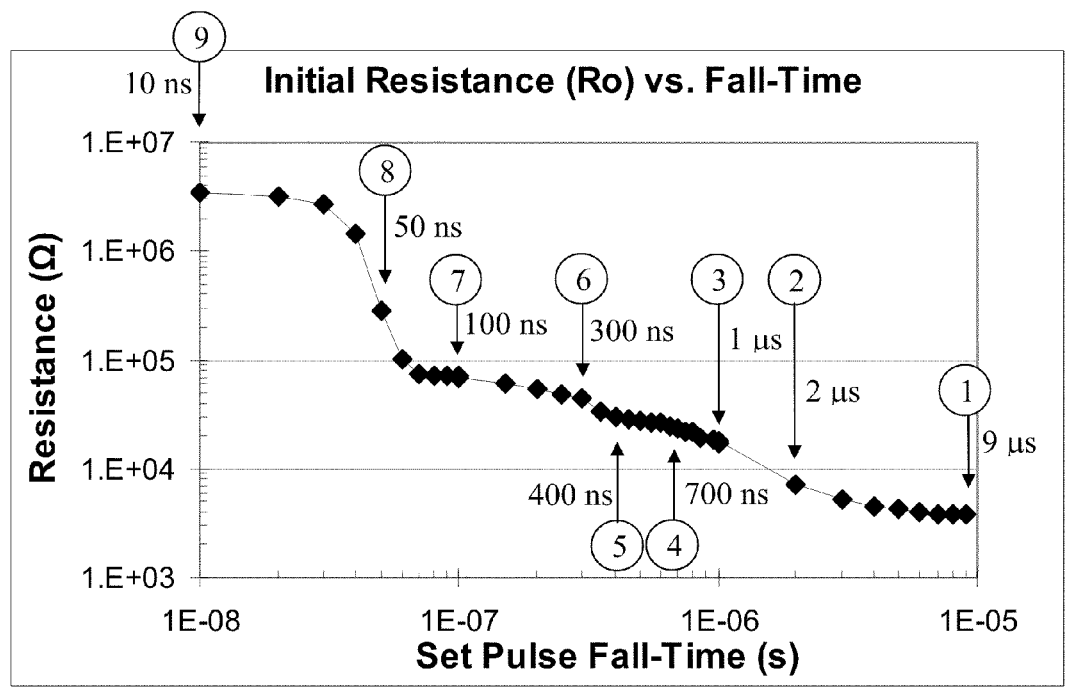
FIG. 11 shows the selection of nine programming states for inclusion in an illustrative multilevel programming scheme.

FIG. 11 shows the variation in initial device resistance as a function of the falltime of the programming pulse. The data in FIG. 11 is similar to the data shown in FIG. 10, except that it includes falltimes below 100 ns and includes a larger time increment between data points. The data presented in FIG. 10 were more finely resolved to more fully illustrate the range of crystalline programming states that could be reproducibly achieved. The data in FIG. 11 indicate that programming with a pulse having falltimes up to ~30 ns transformed the device to its reset state and that the device transformed from the reset state through a series of mixed crystalline-amorphous programming states to the face-centered cubic crystalline programming state when the programming pulse falltime was increased from ~30 ns to ~70 ns. The face-centered cubic crystalline programming state was stabilized with programming pulses having falltimes in the range from ~70 ns to ~100 ns. For programming pulses with falltimes above ~100 ns, the device transforms from the face-centered cubic crystalline programming state through a series of mixed crystalline phase programming states to the hexagonal crystalline phase programming state as described in Example 3 hereinabove.

To demonstrate multilevel performance free from overlap of states caused by drift, selected programming states from among those included in FIG. 11 were identified for evaluation of drift. Nine programming states were selected for drift measurements. The nine states and the programming pulse falltime associated with each state are identified in FIG. 11. The initial resistance value ($R_0$) for each programming state corresponds to the resistance shown in FIG. 11. For each of the nine programming states, subsequent evaluation of the variation in resistance with time was completed.

Figure 12:
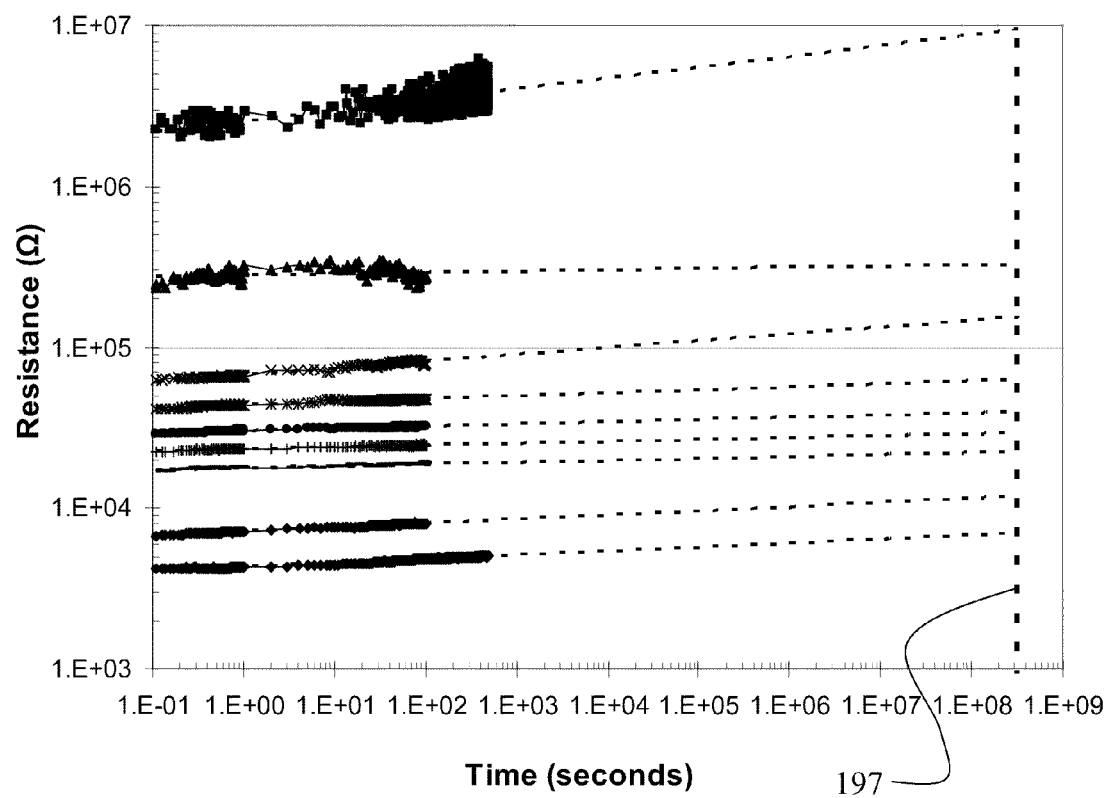
FIG. 12 shows the drift in resistance with time of the nine programming states identified in FIG. 11.

FIG. 12 shows the results of the drift experiments for each of the nine programming states identified in FIG. 11. The resistance of each state is shown as a function of time. The nine states are arranged in order of increasing resistance and correspond, respectively, to states 1-9 identified in FIG. 11. The data for each programming state was fit with the power law model described hereinabove and extrapolated in time. The data extrapolations are shown as dashed lines that extend to dotted line 197, which is drawn to mark a time of ten years. Numerical results obtained from the data are summarized below:

| Programming State | Programming Falltime | Initial Resistance ($R_0$) | Drift Coefficient (d) | 10-Year Extrapolated Resistance |
|---|---|---|---|---|
| 1 | 9 μs | 3.9 kΩ | 0.03 | 6.5 kΩ |
| 2 | 2 μs | 7.2 kΩ | 0.03 | 11.9 kΩ |
| 3 | 1 μs | 17.8 kΩ | 0.01 | 22.5 kΩ |
| 4 | 700 ns | 23.3 kΩ | 0.01 | 29.4 kΩ |
| 5 | 400 ns | 30.2 kΩ | 0.01 | 39.6 kΩ |
| 6 | 300 ns | 43.8 kΩ | 0.02 | 63.3 kΩ |
| 7 | 100 ns | 67.5 kΩ | 0.04 | 155 kΩ |
| 8 | 50 ns | 282 kΩ | 0.01 | 329 kΩ |
| 9 | 10 ns | 3.44 MΩ | 0.06 | 11.6 MΩ |

The results indicate that the crystalline programming states exhibit low drift coefficients and that the drift in resistance after 10 years is insufficient to cause overlapping of the resistance states. Although drift causes a slight increase in the resistance of the crystalline programming states, the drift for each programming state is insufficient to cause the resistance of the state to increase to the initial resistance observed for the neighboring programming state. As a result, overlapping of states does not occur over an extrapolated time period of at least ten years and a robust multilevel programming scheme is achieved.

The programming scheme demonstrated in this example is based on nine programming states that include a plurality of crystalline programming states. The programming states include an amorphous programming state (e.g. the reset state or the programming state achieved with a programming pulse having a falltime of 10 ns), a mixed crystalline-amorphous state (e.g. the programming state achieved with a programming pulse having a falltime of 50 ns), crystalline programming states that consist essentially of a single crystalline phase (e.g. the programming states achieved with programming pulses having falltimes of 100 ns or 9 µs), and crystalline programming states that include a mixture of crystalline phase (e.g. the programming state achieved with a programming pulse having falltimes of 300 ns, 400 ns, 700 ns, 1 µs, or 2 µs). Other programming schemes including more or less than nine programming states are readily envisionable by those of skill in the art based on the disclosure herein.

The combination of states selected for a programming scheme includes two or more crystalline programming states along with a third programming state and the method of programming includes transforming the phase-change device to each of the programming states at least once. The two or more crystalline programming states may include one or more crystalline phases. In one embodiment, a crystalline programming state consists essentially of one crystalline phase. In another embodiment, a crystalline programming state may include two or more crystalline phases. The programming scheme may include one or more crystalline programming states based on one crystalline phase, one or more crystalline programming states based on a mixture of two or more crystalline phases, or a combination thereof. The third programming state may be a crystalline programming state (based on one crystalline phases or a combination of two or more crystalline phases), an amorphous programming state, or a mixed crystalline-amorphous programming state.

In one embodiment, the magnitude of drift is sufficiently small to prevent overlapping of any two programming states in a multilevel programming scheme for at least one month. In another embodiment, the magnitude of drift is sufficiently small to prevent overlapping of any two programming states in a multilevel programming scheme for at least one year. In still another embodiment, the magnitude of drift is sufficiently small to prevent overlapping of any two programming states in a multilevel programming scheme for at least five years. In a further embodiment, the magnitude of drift is sufficiently small to prevent overlapping of any two programming states in a multilevel programming scheme for at least ten years.

The results described in the foregoing examples indicate that crystalline programming states exhibit low drift and are good candidates for inclusion in multilevel programming schemes. Although the face-centered cubic, hexagonal, and mixtures thereof have been disclosed as illustrative crystalline phases, the instant invention generally extends to electrically-induced transformations among crystalline phases having other crystallographic structures, including stoichiometric and non-stoichiometric compositions as well as crystalline phases including defects or distortions from regular crystallographic structures. Representative crystallographic structures that may be attained by phase-change compositions include orthorhombic, tetragonal, trigonal, triclinic, monoclinic, body-centered cubic, and cubic close packed.

Those skilled in the art will appreciate that the methods and designs described above have additional applications and that the relevant applications are not limited to those specifically recited above. Also, the present invention may be embodied in other specific forms without departing from the essential characteristics as described herein. The embodiments described above are to be considered in all respects as illustrative only and not restrictive in any manner.

We claim:

1. A method of programming a variable resistance material comprising:
   providing a variable resistance material;
   a first programming step, said first programming step transforming said variable resistance material to a first crystalline programming state, said first crystalline programming state having a first resistance;
   a second programming step, said second programming step transforming said variable resistance material to a second crystalline programming state, said second crystalline programming state having a second resistance; and
   a third programming step, said third programming step transforming said variable resistance material to a third programming state, said third programming state being a mixed crystalline-amorphous programming state, said third programming state having a third resistance.

2. The method of claim 1, wherein said variable resistance material is a phase-change material.

3. The method of claim 2, wherein said phase-change material comprises Sb, Te, As, Ga, Ge, or In.

4. The method of claim 1, wherein said variable resistance material is a chalcogenide material.

5. The method of claim 4, wherein said chalcogenide material comprises Te or Se.

6. The method of claim 5, wherein said chalcogenide material further comprises Ge, Sb, In, or As.

7. The method of claim 1, wherein said first crystalline programming state consists essentially of a first crystalline phase.

8. The method of claim 7, wherein said crystalline phase is cubic.

9. The method of claim 8, wherein said crystalline phase is face-centered cubic.

10. The method of claim 7, wherein said crystalline phase is hexagonal.

11. The method of claim 7, wherein said second crystalline programming state consists essentially of a second crystalline phase.

12. The method of claim 11, wherein said first crystalline phase is cubic and said second crystalline phase is hexagonal.

13. A method of programming a variable resistance material comprising:
   providing a variable resistance material;
   a first programming step, said first programming step transforming said variable resistance material to a first crystalline programming state, said first crystalline programming state consisting essentially of a first crystalline phase, said first crystalline programming state having a first resistance;
   a second programming step, said second programming step transforming said variable resistance material to a second crystalline programming state, said second crystalline programming state consisting essentially of a second crystalline phase, said second crystalline programming state having a second resistance; and
   a third programming step, said third programming step transforming said variable resistance material to a third crystalline programming state, said third programming state having a third resistance.

14. The method of claim 13, wherein said third crystalline programming state comprises a third crystalline phase and a fourth crystalline phase.

15. The method of claim 14, wherein said third crystalline phase is said first crystalline phase.

16. The method of claim 15, wherein said fourth crystalline phase is said second crystalline phase.

17. The method of claim 13, wherein said third programming state consists essentially of a third crystalline phase.

18. A method of programming a variable resistance material comprising:
providing a variable resistance material;
a first programming step, said first programming step transforming said variable resistance material to a first crystalline programming state, said first crystalline programming state consisting essentially of a first crystalline phase, said first crystalline programming state having a first resistance;
a second programming step, said second programming step transforming said variable resistance material to a second crystalline programming state, said second crystalline programming state comprising a second crystalline phase and a third crystalline phase, said second crystalline programming state having a second resistance; and
a third programming step, said third programming step transforming said variable resistance material to a third programming state, said third programming state having a third resistance.

19. The method of claim 18, wherein said second crystalline phase is said first crystalline phase.

20. The method of claim 18, wherein said third programming state is an amorphous or mixed crystalline-amorphous programming state.

21. The method of claim 18, wherein said third programming state comprises a fourth crystalline phase and a fifth crystalline phase.

22. The method of claim 21, wherein said fourth crystalline phase is said second crystalline phase.

23. The method of claim 22, wherein said fifth crystalline phase is said third crystalline phase.

24. A method of programming a variable resistance material comprising:
providing a variable resistance material;
a first programming step, said first programming step transforming said variable resistance material to a first crystalline programming state, said first crystalline programming state consisting essentially of a first crystalline phase, said first crystalline programming state having a first resistance;
a second programming step, said second programming step transforming said variable resistance material to a second crystalline programming state, said second crystalline programming state having a second resistance; and
a third programming step, said third programming step transforming said variable resistance material to a third crystalline programming state, said third programming state having a third resistance.

25. A method of programming a variable resistance material comprising:
providing a variable resistance material;
a first programming step, said first programming step transforming said variable resistance material to a first crystalline programming state, said first crystalline programming state comprising a first crystalline phase and a second crystalline phase, said first crystalline programming state having a first resistance;
a second programming step, said second programming step transforming said variable resistance material to a second crystalline programming state, said second crystalline programming state having a second resistance, said second resistance differing from said first resistance; and
a third programming step, said third programming step transforming said variable resistance material to a third programming state, said third programming state having a third resistance, said third resistance differing from said first resistance and said second resistance.

26. The method of claim 25, wherein said first crystalline phase is cubic.

27. The method of claim 25, wherein said first crystalline phase is hexagonal.

28. The method of claim 25, wherein said second crystalline programming state comprises a third crystalline phase and a fourth crystalline phase.

29. The method of claim 28, wherein said third crystalline phase is said first crystalline phase.

30. The method of claim 29, wherein said fourth crystalline phase is said second crystalline phase.

31. The method of claim 25, wherein said third programming state is an amorphous or mixed crystalline-amorphous programming state.

32. The method of claim 25, wherein said third programming state is a third crystalline programming state.

33. A method of programming a variable resistance material comprising:
providing a variable resistance material;
a first programming step, said first programming step transforming said variable resistance material to a first crystalline programming state, said first crystalline programming state having a first resistance;
a second programming step, said second programming step transforming said variable resistance material to a second crystalline programming state, said second crystalline programming state having a second resistance, said second resistance differing from said first resistance; and
a third programming step, said third programming step transforming said variable resistance material to a third crystalline programming state, said third programming state having a third resistance, said third resistance differing from said first resistance and said second resistance.

34. A method of programming a variable resistance material comprising:
providing a variable resistance material;
a first programming step, said first programming step transforming said variable resistance material to a first crystalline programming state, said first crystalline programming state having a first resistance;
a second programming step, said second programming step transforming said variable resistance material to a second crystalline programming state, said second crystalline programming state having a second resistance; and
a third programming step, said third programming step transforming said variable resistance material to a third programming state, said third programming state having a third resistance; and
a fourth programming step, said fourth programming step transforming said variable resistance material to a fourth programming state, said fourth programming state having a fourth resistance.

35. The method of claim 34, wherein said fourth programming state is an amorphous programming state.

36. The method of claim 35, wherein said third programming state is a mixed crystalline-amorphous programming state.

37. A method of programming a variable resistance material comprising:
providing a variable resistance material;
a first programming step, said first programming step transforming said variable resistance material to a first crystalline programming state, said first crystalline programming state having a first resistance;
a second programming step, said second programming step transforming said variable resistance material to a second crystalline programming state, said second crystalline programming state having a second resistance, said first resistance being less than said second resistance; and
a third programming step, said third programming step transforming said variable resistance material to a third programming state, said third programming state having a third resistance said second resistance being less than said third resistance;
wherein said first resistance increases to a fourth resistance within a first time period following said first programming step, said fourth resistance being less than said second resistance.

38. The method of claim 27, wherein said first time period is one year.

39. The method of claim 27, wherein said first time period is five years.

40. The method of claim 27, wherein said first time period is ten years.

41. The method of claim 27, wherein said second resistance spontaneously increases to a fifth resistance within said first time period following said second programming step, said fifth resistance being less than said third resistance.

42. The method of claim 41, wherein said first time period is one year.

43. The method of claim 41, wherein said first time period is five years.

44. The method of claim 41, wherein said first time period is ten years.

45. The method of claim 41, wherein said third programming state is a crystalline programming state.

46. A method of programming a variable resistance material comprising:
providing a variable resistance material;
a first programming step, said first programming step transforming said variable resistance material to a first crystalline programming state, said first crystalline programming state including a first crystalline phase and a second crystalline phase, said first crystalline programming state having a first resistance; and
a second programming step, said second programming step transforming said variable resistance material to a second crystalline programming state, said second crystalline programming state including a third crystalline phase and a fourth crystalline phase, said second crystalline programming state having a second resistance.

47. The method of claim 46, wherein said first crystalline phase is cubic.

48. The method of claim 47, wherein said second crystalline phase is hexagonal.

49. The method of claim 47, wherein said third crystalline phase is cubic.

50. The method of claim 47, wherein said third crystalline phase is hexagonal.

* * * * *